United States Patent
Makino

(10) Patent No.: US 8,273,637 B2
(45) Date of Patent: *Sep. 25, 2012

(54) METHOD FOR MANUFACTURING SEMICONDUCTOR DEVICE

(75) Inventor: Kenichiro Makino, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/106,301

(22) Filed: May 12, 2011

(65) Prior Publication Data

US 2011/0212597 A1     Sep. 1, 2011

Related U.S. Application Data

(63) Continuation of application No. 12/564,951, filed on Sep. 23, 2009, now Pat. No. 7,943,487.

(30) Foreign Application Priority Data

Sep. 29, 2008   (JP) ................................. 2008-249401

(51) Int. Cl.
    H01L 21/762     (2006.01)
(52) U.S. Cl. ................. 438/458; 438/164; 257/E21.578
(58) Field of Classification Search .................. 438/164, 438/458
    See application file for complete search history.

(56) References Cited

U.S. PATENT DOCUMENTS

| 6,191,007 | B1 | 2/2001 | Matsui et al. |
| 6,380,019 | B1 | 4/2002 | Yu et al. |
| 6,380,046 | B1 | 4/2002 | Yamazaki |
| 7,199,024 | B2 | 4/2007 | Yamazaki |
| 7,288,458 | B2 | 10/2007 | Adetutu et al. |
| 7,682,931 | B2 | 3/2010 | Yamazaki et al. |
| 7,811,884 | B2 | 10/2010 | Yamazaki et al. |
| 7,943,487 | B2 * | 5/2011 | Makino ........................ 438/458 |
| 2002/0109144 | A1 | 8/2002 | Yamazaki |
| 2007/0173000 | A1 | 7/2007 | Yamazaki |
| 2007/0228452 | A1 | 10/2007 | Asami |
| 2008/0242050 | A1 | 10/2008 | Yamazaki et al. |
| 2010/0081252 | A1 | 4/2010 | Makino |
| 2010/0120226 | A1 | 5/2010 | Yamazaki et al. |
| 2010/0311222 | A1 | 12/2010 | Yamazaki et al. |

FOREIGN PATENT DOCUMENTS

| JP | 05-211128 | 8/1993 |
| JP | 11-045862 | 2/1999 |
| JP | 2000-012864 | 1/2000 |
| JP | 2005-252244 | 9/2005 |

* cited by examiner

*Primary Examiner* — Alexander Ghyka
(74) *Attorney, Agent, or Firm* — Eric J. Robinson; Robinson Intellectual Property Law Office, P.C.

(57) ABSTRACT

Suppression of generation of a stripe pattern (unevenness) when an SOI substrate is manufactured by a glass substrate and a single crystal semiconductor substrate bonded to each other. A single crystal semiconductor substrate is irradiated with ions so that a fragile region is formed in the single crystal semiconductor substrate; a depression or a projection is formed in a region of a surface of an insulating layer provided on the single crystal semiconductor substrate, the region corresponding to the periphery of the single crystal semiconductor substrate; the single crystal semiconductor substrate is bonded to a base substrate; thermal treatment is performed thereon to separate the single crystal semiconductor substrate at the fragile region, so that a single crystal semiconductor layer is formed over the base substrate; and the single crystal semiconductor layer in the region corresponding to the periphery is removed.

12 Claims, 11 Drawing Sheets

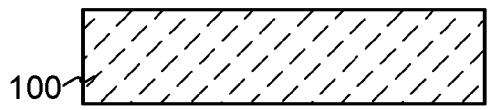
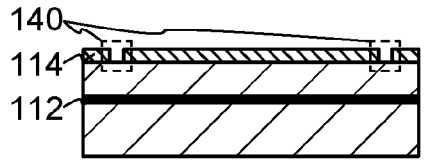
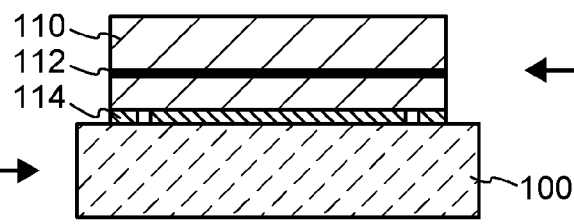
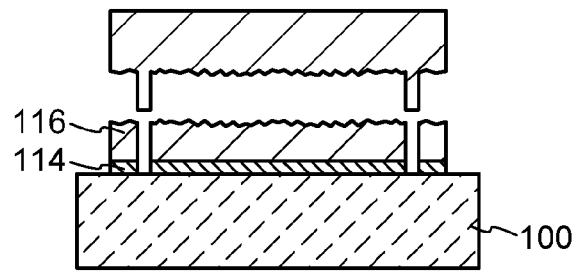
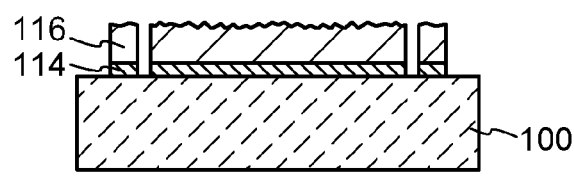

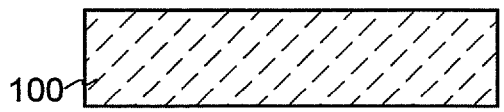
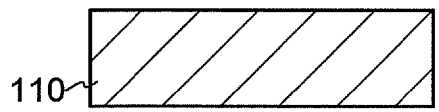
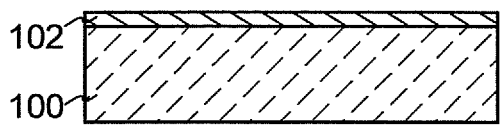
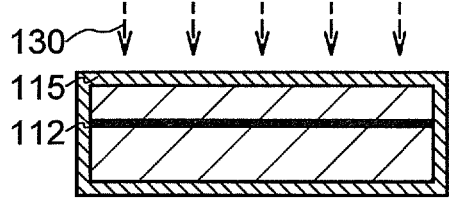
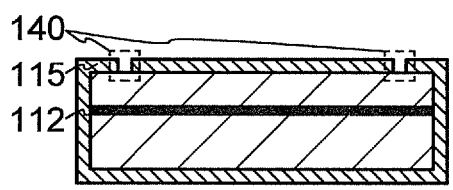
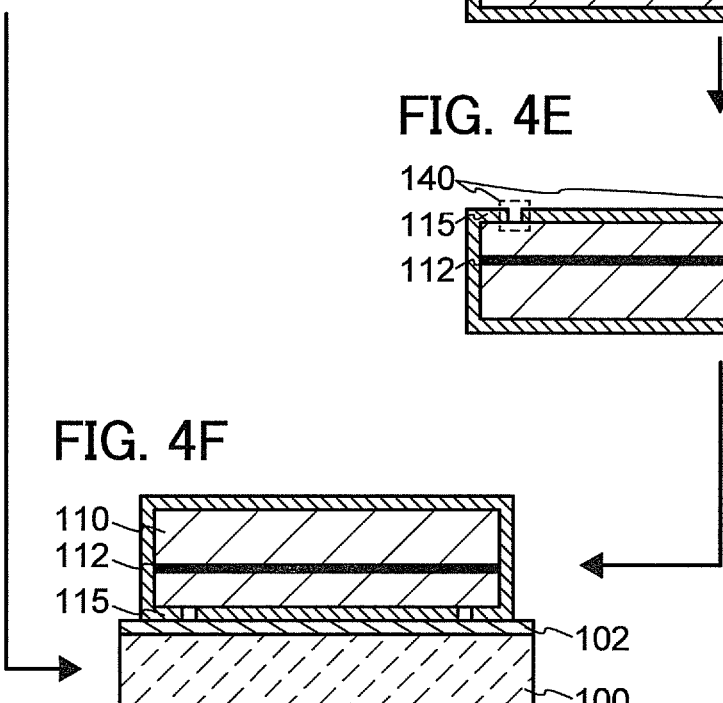
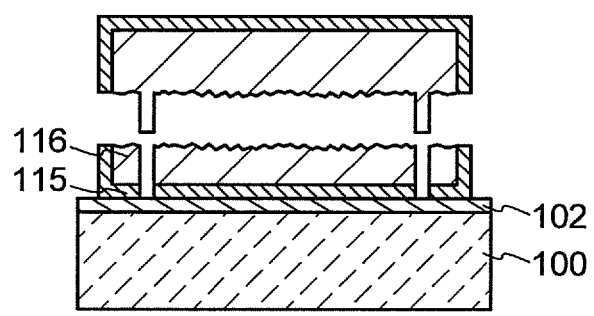

METHOD FOR MANUFACTURING SEMICONDUCTOR DEVICE

BACKGROUND OF THE INVENTION

1. Field of the Invention

The present invention relates to a method for manufacturing an SOI (silicon on insulator) substrate and a method for manufacturing a semiconductor device using the SOI substrate.

2. Description of the Related Art

In recent years, an integrated circuit using an SOI (silicon on insulator) substrate in which a thin single crystal semiconductor layer is provided on an insulating surface, instead of a bulk silicon wafer has been researched. An SOI substrate enables parasitic capacitance formed by a drain of a transistor and a substrate to be small, and therefore an SOI substrate has greatly attracted attention as an element for improving performance of semiconductor integrated circuits.

The Smart Cut (registered trademark) method is known as one of methods for manufacturing an SOI substrate (for example, see Patent Document 1). An outline of the method for manufacturing an SOI substrate by the Smart Cut (registered trademark) method is described below. First, hydrogen ions are implanted into a silicon wafer by an ion implantation method to form a microbubble layer at a predetermined depth from the surface. Then, the silicon wafer into which the hydrogen ions are implanted is bonded to another silicon wafer with a silicon oxide film interposed therebetween. After that, thermal treatment is performed, so that a thin film of the silicon wafer into which the hydrogen ions are implanted is separated at the microbubble layer. Accordingly, a single crystal silicon film is formed over the other bonded silicon wafer. Smart Cut (registered trademark) method may be referred to as a hydrogen ion implantation separation method.

A method has also been proposed in which a single crystal silicon layer is formed over a base substrate made of glass by such Smart Cut (registered trademark) method (for example, see Patent Document 2). Glass substrates, the areas of which can be increased more easily than silicon wafers and which are less expensive than silicon wafers, are mainly used for manufacturing liquid crystal display devices and the like. With the use of glass substrates as base substrates, inexpensive large-area SOI substrates can be manufactured.

[Patent Document]

Patent Document 1: Japanese Published Patent Application No. H05-211128

Patent Document 2: Japanese Published Patent Application No. 2005-252244

SUMMARY OF THE INVENTION

When a single crystal silicon layer is formed over a glass substrate by the above-described Smart Cut method or the like, a stripe pattern (unevenness) is generated in the surface of the silicon layer. The unevenness causes the variation of characteristics of semiconductor elements formed, and leads to drop in the manufacturing yield of a semiconductor device. For example, in the case where a panel which is to be used for a display device is manufactured, variations of characteristics of a semiconductor element used as a switching element affect the display quality very seriously.

In view of the forgoing, one object of one embodiment of the present invention is to suppress the generation of the stripe pattern (unevenness) when an SOI substrate is manufactured by bonding a glass substrate and a single crystal semiconductor substrate to each other. One object of one embodiment of the present invention is to provide a high-quality semiconductor device with suppressed generation of the above-described unevenness.

According to one embodiment of the present invention, a depression or a projection is provided in a part (particularly the periphery) of the surface which is to be bonded, in manufacturing an SOI substrate through the bonding so that a region where the bonding is not performed by design is formed. Further, a single crystal semiconductor layer formed in the region is removed in forming a semiconductor element later. Details thereof will be described below.

According to one embodiment of the present invention, the following steps are included: a single crystal semiconductor substrate is irradiated with accelerated ions so that a fragile region is formed in the single crystal semiconductor substrate; a depression or a projection is formed in a region of a surface of an insulating layer provided on the single crystal semiconductor substrate, the region corresponding to the periphery of the single crystal semiconductor substrate; the single crystal semiconductor substrate is bonded to a base substrate with the insulating layer interposed therebetween; thermal treatment is performed thereon to separate the single crystal semiconductor substrate at the fragile region, so that a single crystal semiconductor layer is formed over the base substrate; and the single crystal semiconductor layer in the region corresponding to the periphery is removed in patterning the single crystal semiconductor layer when a semiconductor element is formed.

According to one embodiment of the present invention, the following steps are included: a single crystal semiconductor substrate is irradiated with accelerated ions so that a fragile region is formed in the single crystal semiconductor substrate; a depression or a projection is formed in a region of a surface of an insulating layer provided on a base substrate, the region corresponding to the periphery of the single crystal semiconductor substrate; the single crystal semiconductor substrate is bonded to the base substrate with the insulating layer interposed therebetween; thermal treatment is performed thereon to separate the single crystal semiconductor substrate at the fragile region, so that a single crystal semiconductor layer is formed over the base substrate; and the single crystal semiconductor layer in the region corresponding to the periphery is removed in patterning the single crystal semiconductor layer to form an island-shaped semiconductor layer.

According to one embodiment of the present invention, the following steps are included: a single crystal semiconductor substrate is irradiated with accelerated ions so that a fragile region is formed in the single crystal semiconductor substrate; a depression or a projection is formed in a region of a surface of a base substrate, to which the periphery of the single crystal semiconductor substrate is to be bonded; the single crystal semiconductor substrate is bonded to the base substrate with an insulating layer interposed therebetween; thermal treatment is performed thereon to separate the single crystal semiconductor substrate at the fragile region, so that a single crystal semiconductor layer is formed over the base substrate; and the single crystal semiconductor layer in the region corresponding to the periphery is removed in patterning the single crystal semiconductor layer to form an island-shaped semiconductor layer.

In the above-described embodiment, it is preferable to irradiate the single crystal semiconductor layer with laser light to improve the characteristics of the single crystal semiconductor layer. As the base substrate, a glass substrate can be used.

In this specification, a "single crystal" means, when attention is paid to certain crystal axes, a crystal in which the crystal axes are aligned in the same direction in any part of a sample and also in which there is no crystal boundaries between crystals. Note that, in this specification, the single crystal includes in its category a crystal in which the direction of crystal axes is uniform as described above and which has no grain boundaries even when it includes a crystal defect or a dangling bond. In addition, re-single-crystallization of a single crystal semiconductor layer means that a semiconductor layer having a single crystal structure returns to one having a single crystal structure after being in a different state from the single crystal structure (e.g., a liquid-phase state); it can be said that re-single-crystallization of a single crystal semiconductor layer means that a single crystal semiconductor layer is recrystallized to form a single crystal semiconductor layer.

Note that a semiconductor device in this specification generally indicates any device capable of functioning by utilizing semiconductor characteristics, and electro-optic devices, semiconductor circuits, and electronic devices are all semiconductor devices.

In addition, in this specification, a display device includes in its category a light-emitting device and a liquid crystal display device. The light-emitting device includes a light-emitting element, and the liquid crystal display device includes a liquid crystal element. A light-emitting element includes in its category an element whose luminance is controlled by a current or a voltage; specifically, an inorganic electroluminescent (EL) element, an organic EL element, and the like are given.

According to one embodiment of the present invention, a depression or a projection is provided in a part (the periphery) of a surface which is to be bonded, to form a region in which the bonding is not performed by design. In this manner, generation of stress caused by expansion or contraction of a substrate due to thermal treatment can be suppressed, thereby suppressing generation of a stripe pattern (unevenness) in a single crystal semiconductor layer.

In the periphery of the single crystal semiconductor layer, the bonding strength tends to be insufficient due to the structure of a single crystal semiconductor substrate. Therefore, the periphery of the semiconductor layer is removed when a semiconductor element is formed; at that time, the semiconductor layer in the region in which the depression or the projection is provided can also be removed, whereby the above-described depression or projection does not adversely affect a semiconductor device.

BRIEF DESCRIPTION OF THE DRAWINGS

FIGS. 1A to 1F are cross-sectional views showing an example of the manufacturing method of an SOI substrate and a semiconductor device.

FIGS. 4A to 4G are cross-sectional views showing an example of the manufacturing method of an SOI substrate and a semiconductor device.

DETAILED DESCRIPTION OF THE INVENTION

Figure 2A:
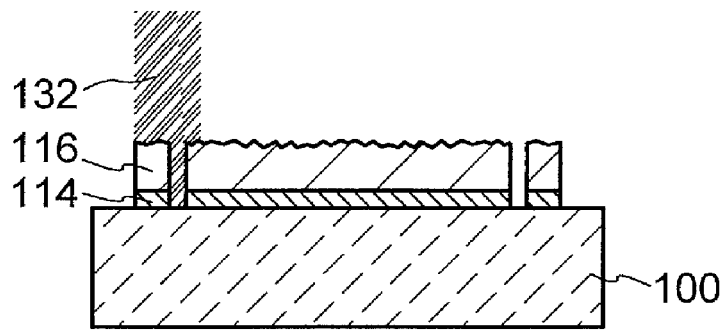
FIGS. 2A to 2C are cross-sectional views showing an example of the manufacturing method of an SOI substrate and a semiconductor device.

Although embodiments of the present invention will be described with reference to the accompanying drawings, the present invention can be implemented in various different modes, and it is to be easily understood that various changes and modifications in modes and details thereof will be apparent to those skilled in the art without departing from the meaning and scope of the present invention. Therefore, the present invention is construed without being limited to the description of the embodiments. Note that the same portions or portions having the same functions are denoted by the same reference numerals in the drawings, and the description thereof is made only once.

[Embodiment 1]

In this embodiment, one example of a manufacturing method of a semiconductor substrate (SOI substrate) and a semiconductor device using the semiconductor substrate (SOI substrate) will be described with reference to drawings. Specifically, the case where a semiconductor substrate in which a single crystal semiconductor layer is provided over a base substrate will be described.

First, a base substrate 100 and a single crystal semiconductor substrate 110 are prepared (see FIGS. 1A and 1B).

As the base substrate 100, a substrate made of an insulator can be used. In specific, a variety of glass substrates that are used in the electronics industry, such as aluminosilicate glass substrates, aluminoborosilicate glass substrates, and barium borosilicate glass substrates; quartz substrates; ceramic substrates; sapphire substrates can be used. Note that the heat resistance of the above-described glass substrate is generally improved by containing a large amount of boric acid ($B_2O_3$); and more-practical heat-resistant glass can be obtained by a larger amount of barium oxide (BaO) than boric acid. Therefore, it is preferable that a glass substrate containing more BaO than $B_2O_3$ is used. Alternatively, a single crystal semiconductor substrate (for example, a single crystal silicon substrate) may be used as the base substrate 100. In this embodiment, the case of using a glass substrate as the base substrate 100 is described. Cost reduction can be achieved when a glass substrate that can have a larger size and is inexpensive is used as the base substrate 100.

It is preferable that the surface of the base substrate 100 be cleaned in advance. Specifically, ultrasonic cleaning is performed on the base substrate 100 with the use of a hydrochloric acid/hydrogen peroxide mixture (HPM), a sulfuric acid/hydrogen peroxide mixture (SPM), an ammonium hydroxide/hydrogen peroxide mixture (APM), diluted hydrogen fluoride (DHF), or the like. Such cleaning can improve the flatness of the surface of the base substrate 100 and remove abrasive particles remaining on the surface of the base substrate 100.

As the single crystal semiconductor substrate 110, for example, a single crystal semiconductor substrate formed using an element belonging to Group 14 of the Periodic Table, such as a single crystal silicon substrate, a single crystal germanium substrate, or a single crystal silicon germanium substrate, can be used. Alternatively, a compound semiconductor substrate formed using gallium arsenide, indium phosphide, or the like may be used. The typical sizes of commercial silicon substrates are 5 inches (125 mm) in diameter, 6 inches (150 mm) in diameter, 8 inches (200 mm) in diameter, 12 inches (300 mm) in diameter, and 16 inches (400 mm) in diameter, and the typical shape thereof is circular. Note that the shape of the single crystal semiconductor substrate 110 is not limited to circular, and a single crystal semiconductor substrate processed into a rectangular shape or the like can be used as well. Further, the single crystal semiconductor substrate 110 can be manufactured by a CZ method or FZ (Floating Zone) method.

From the point of view of removal of contaminants, it is preferable that the surface of the single crystal semiconductor substrate 110 be cleaned by a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like. Diluted hydrogen fluoride and ozone water may be discharged alternately to clean the surface of the single crystal semiconductor substrate 110.

Next, a fragile region 112 where the crystal structure is damaged is formed at a predetermined depth from the surface of the single crystal semiconductor substrate 110. Then, the base substrate 100 and the single crystal semiconductor substrate 110 are bonded to each other with an insulating layer 114 interposed therebetween (see FIGS. 1C and 1D).

At that time, in this embodiment, a depression 140 (or a projection) is formed in a region of the surface of the insulating layer 114, the region corresponding to the periphery of the single crystal semiconductor substrate 110, so that a portion where the base substrate 100 and the single crystal semiconductor substrate 110 are not bonded to each other is formed by design (see FIG. 1C). Accordingly, stress caused by thermal treatment or the like at the time of the bonding can be suppressed, thereby suppressing generation of a stripe pattern (unevenness) in a semiconductor layer.

Although the stress is suppressed by the depression 140 formed in the insulating layer 114 according to this embodiment, one embodiment of the present invention is construed without being limited to this structure. A projection may be formed instead of the depression. As examples of the method for forming the depression, patterning after the formation of the insulating layer 114, marking by laser light irradiation, and the like can be given. As examples of the method for forming the projection, patterning after the formation of the insulating layer 114, bonding of a particle with an appropriate size on the surface of the insulating layer 114, and the like can be given.

The fragile region 112 can be formed by irradiating the single crystal semiconductor substrate 110 with ions of hydrogen or the like having kinetic energy.

As the insulating layer 114, a single layer of an insulating layer such as a silicon oxide film, a silicon oxynitride film, a silicon nitride film, or a silicon nitride oxide film, or a stacked layer thereof can be used. These films can be formed by a thermal oxidation method, a CVD method, a sputtering method, or the like.

Note that in this specification, silicon oxynitride means the one that contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0.1 atomic % and less than or equal to 10 atomic %, respectively. Further, silicon nitride oxide means the one that contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 30 atomic %, respectively. Note that the above-described ranges are the ranges when silicon oxynitride and silicon nitride oxide are measured using Rutherford backscattering spectrometry (RBS) or hydrogen forward scattering (HFS). In addition, the total for the content ratio of the constituent elements does not exceed 100 atomic %.

Before the bonding of the base substrate 100 and the single crystal semiconductor substrate 110, it is preferable to perform surface treatment on a surface at which the bonding is performed, that is, the surfaces of the base substrate 100 and the insulating layer 114 formed on the single crystal semiconductor substrate 110 in this embodiment. Surface treatment can improve the bonding strength between the insulating layer 114 and the base substrate 100.

As examples of the surface treatment, wet treatment, dry treatment, and combination of wet treatment and dry treatment can be given. Different wet treatments or different dry treatments may be combined to be performed.

As examples of the wet treatment, ozone treatment using ozone water (ozone water cleaning), megasonic cleaning, two-fluid cleaning (method in which functional water such as pure water or hydrogenated water and a carrier gas such as nitrogen are sprayed together), and the like can be given. As examples of the dry treatment, ultraviolet treatment, ozone treatment, plasma treatment, plasma treatment with bias application, radical treatment, and the like can be given. The above-described surface treatment on an object (a single crystal semiconductor substrate, an insulating layer formed on a single crystal semiconductor substrate, a support substrate, or an insulating layer formed on a support substrate) has an effect on the surface of the object to improve the hydrophilicity and cleanliness. As a result, the boning strength between the substrates can be improved.

The wet treatment is effective for removal of macro dust and the like bonded on the surface of the object; the dry treatment is effective for removal or decomposition of micro dust and the like such as an organic substance bonded on the surface of the object. The case in which the dry treatment such as ultraviolet treatment is performed and then the wet treatment such as cleaning is performed is preferable because the surface of the object can be made clean and hydrophilic and generation of watermarks in the surface of the object can be suppressed.

As the dry treatment, it is preferable to perform surface treatment using ozone or oxygen in an active state such as singlet oxygen. Ozone or oxygen in an active state such as singlet oxygen enables organic substances bonded on the surface of the object to be removed or decomposed effectively. Further, the treatment using ozone or oxygen in an active state such as singlet oxygen may be combined with treatment using ultraviolet light having wavelengths less than 200 nm, so that the organic substances bonded on the surface of the object can be removed more effectively. Specific description thereof will be made below.

For example, irradiation with ultraviolet light under the atmosphere containing oxygen is performed to perform the surface treatment of the object. Irradiation with ultraviolet light having wavelengths less than 200 nm and ultraviolet light having wavelengths greater than or equal to 200 nm under the atmosphere containing oxygen may be performed, so that ozone and singlet oxygen can be generated. Alternatively, irradiation with ultraviolet light having wavelengths less than 180 nm may be performed, so that ozone and singlet oxygen can be generated.

An example of the reaction which is caused by the irradiation with ultraviolet light having wavelengths less than 200 nm and ultraviolet light having wavelengths greater than or equal to 200 nm under the atmosphere containing oxygen is described below.

$$O_2 + h\nu(\lambda_1 \text{ nm}) \rightarrow O(^3P) + O(^3P) \quad (1)$$

$$O(^3P) + O_2 \rightarrow O_3 \quad (2)$$

$$O_3 + h\nu(\lambda_2 \text{ nm}) \rightarrow O(^1D) + O_2 \quad (3)$$

In the reaction formula (1), irradiation with light (hv) having wavelengths ($\lambda_1$ nm) less than 200 nm under the atmosphere containing oxygen ($O_2$) is performed to generate oxygen atoms in the ground state ($O(^3P)$). Next, in the reaction formula (2), the oxygen atom in the ground state ($O(^3P)$) and oxygen ($O_2$) react with each other to generate ozone ($O_3$). Then, in the reaction formula (3), irradiation with light having wavelengths ($\lambda_2$ nm) greater than or equal to 200 nm under the atmosphere containing generated ozone ($O_3$) is performed to generate singlet oxygen in an excited state ($O(^1D)$). Under the atmosphere containing oxygen, irradiation with ultraviolet light having wavelengths less than 200 nm is performed to generate ozone, and irradiation with ultraviolet light having wavelengths greater than or equal to 200 nm is performed to decompose ozone, so that singlet oxygen is generated. The above-described surface treatment can be performed by, for example, irradiation with a low-pressure mercury lamp ($\lambda_1$=185 nm, $\lambda_2$=254 nm) under the atmosphere containing oxygen.

An example of the reaction which is caused by the irradiation with ultraviolet light having wavelengths less than 180 nm under the atmosphere containing oxygen is described below.

$$O_2 + h\nu(\lambda_3 \text{ nm}) \rightarrow O(^1D) + O(^3P) \quad (4)$$

$$O(^3P) + O_2 \rightarrow O_3 \quad (5)$$

$$O_3 + h\nu(\lambda_3 \text{ nm}) \rightarrow O(^1D) + O_2 \quad (6)$$

In the reaction formula (4), irradiation with light having wavelengths ($\lambda_3$ nm) less than 180 nm under the atmosphere containing oxygen ($O_2$) is performed to generate singlet oxygen in an excited state ($O(^1D)$) and an oxygen atom in the ground state ($O(^3P)$). Next, in the reaction formula (5), the oxygen atom in the ground state ($O(^3P)$) and oxygen ($O_2$) react with each other to generate ozone ($O_3$). Then, in the reaction formula (6), irradiation with light having wavelengths ($\lambda_3$ nm) less than 180 nm under the atmosphere containing generated ozone ($O_3$) is performed to generate singlet oxygen in an excited state and oxygen. Under the atmosphere containing oxygen, irradiation with ultraviolet light having wavelengths less than 180 nm is performed to generate ozone and to decompose ozone or oxygen, so that singlet oxygen is generated. The above-described surface treatment can be performed by, for example, irradiation with a Xe excimer UV lamp under the atmosphere containing oxygen.

Chemical bond of an organic substance bonded on the surface of an object is cut by the ultraviolet light having wavelengths less than 200 nm, and an organic substance or an organic substance in which the chemical bond is cut which is bonded on the surface of the object can be oxidative-decomposed by ozone or singlet oxygen to be removed. With the above-described surface treatment, the hydrophilicity and cleanliness of the surface of the object can be improved, so that the insulating layer 114 and the base substrate 100 can be bonded sufficiently.

Next, separation is performed at the fragile region 112 by thermal treatment, so that a single crystal semiconductor layer 116 is provided over the base substrate 100 with the insulating layer 114 interposed therebetween (see FIGS. 1E and 1F).

With the thermal treatment, an added element is separated out in a microvoid formed in the fragile region 112, so that the internal pressure is increased. The increased pressure causes a crack in the fragile region 112, so that the single crystal semiconductor substrate 110 is separated along the fragile region 112. Since the insulating layer 114 is bonded to the base substrate 100, the single crystal semiconductor layer 116 separated from the single crystal semiconductor substrate 110 remains over the base substrate 100. Note that since the bonding is not performed in the depression 140 (or the projection), the single crystal semiconductor layer 116 is not formed in the region corresponding to the depression 140, of the base substrate 100, by which adverse effect of stress on the film due to the above-described thermal treatment can be lessened, thereby suppressing generation of a stripe pattern (unevenness) in the semiconductor layer.

Figure 2B:
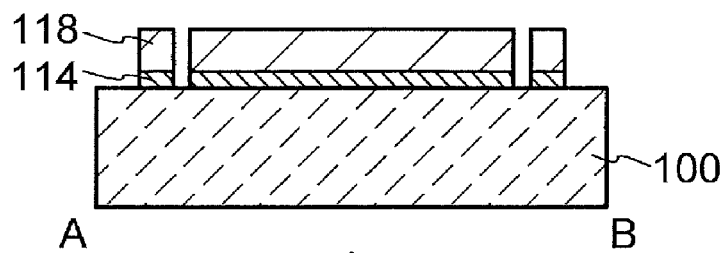
Figure 3A:
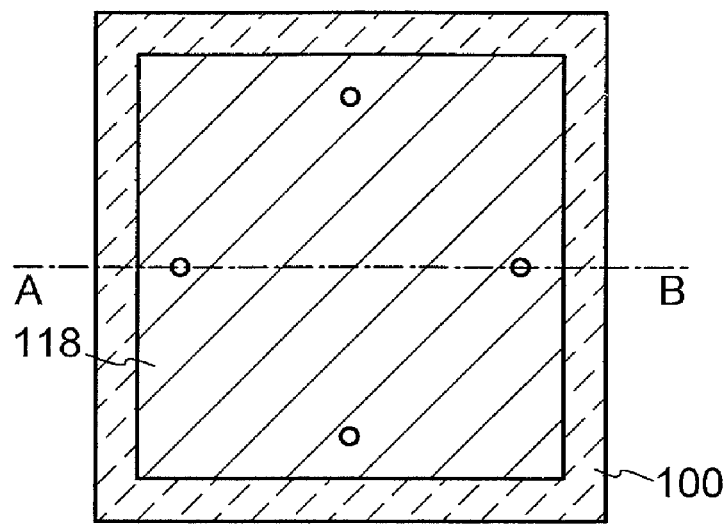
FIGS. 3A and 3B are plan views showing examples of the manufacturing method of an SOI substrate and a semiconductor device.

Next, the surface of the single crystal semiconductor layer 116 is irradiated with laser light 132, thereby forming a single crystal semiconductor layer 118 in which the flatness of the surface is improved and the number of defects is reduced (see FIGS. 2A and 2B and 3A). FIG. 2B corresponds to a cross section taken along A-B in FIG. 3A. The irradiation atmosphere of the laser light 132 is not limited particularly, but an inert atmosphere or a reduced-pressure atmosphere enables the surface flatness of the single crystal semiconductor layer 118 to be improved as compared to the case of the air atmosphere.

Note that it is preferable that the single crystal semiconductor layer 116 be partially melted by the irradiation with the laser light 132. This is because if the single crystal semiconductor layer 116 is melted completely, the microcrystallization of the single crystal semiconductor layer 116 is caused by disordered nucleation of the single crystal semiconductor layer 116 after being in a liquid phase and crystallinity of the single crystal semiconductor layer 116 is lowered. On the other hand, partial melting can cause crystal growth based on the unmelted solid-phase portion, so that crystal quality can be improved as compared to the case where the single crystal semiconductor layer 116 is melted completely. Further, entry of oxygen, nitrogen, or the like from the insulating layer 114 can be suppressed. Note that the partial melting means melting such that the depth to which the single crystal semiconductor layer 116 is melted by laser light irradiation is shallower than the depth of the interface on the insulating layer 114 side (that is, it is shallower than the thickness of the single crystal semiconductor layer 116): that is, an upper layer of the single crystal semiconductor layer 116 is melted to be in a liquid-phase state whereas a lower layer thereof is not melted to be kept in a solid-phase state. Further, complete melting means melting such that the single crystal semiconductor layer 116 is melted to be in the liquid state to the interface between the single crystal semiconductor layer 116 and the insulating layer 114.

A pulsed laser is preferably used for the above-described laser irradiation. This is because a pulsed laser beam having high energy can be emitted instantaneously and a partial melting state can be formed easily. The repetition rate is preferably, but without being limited to, about greater than or equal to 1 Hz and less than or equal to 10 MHz. As examples of the pulsed laser, the following can be given: an Ar laser, a Kr laser, an excimer (ArF, KrF, or XeCl) laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, a gold vapor laser, and the like. Alternatively, a continuous-wave laser may be used as long as partial melting can be performed. As examples of the continuous-wave laser, the following can be given: an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, and the like.

It is necessary that the wavelength of the laser light 132 is a wavelength which can be absorbed by the single crystal semiconductor layer 116. The wavelength is determined in consideration of the skin depth of the laser light and the like. For example, the wavelength can be set in the range of greater than or equal to 250 nm and less than or equal to 700 nm In addition, the energy density of the laser light 132 can be determined in consideration of the wavelength of the laser light 132, the skin depth of the laser light 132, the thickness of the single crystal semiconductor layer 116, or the like. The energy density of the laser light 132 may be set, for example, in the range of greater than or equal to 300 $mJ/cm^2$ and less than or equal to 800 $mJ/cm^2$. Note that the above-described energy density range is an example in the case where a XeCl excimer laser (wavelength: 308 nm) is used as a pulsed laser.

The irradiation with the laser light 132 can be performed under an atmosphere containing oxygen such as the air atmosphere or an inert atmosphere such as a nitrogen atmosphere or an argon atmosphere. In order to perform the irradiation with the laser light 132 under an inert atmosphere, irradiation with the laser light 132 may be performed in an airtight chamber while the atmosphere in the chamber is controlled. In the case where the chamber is not used, an inert atmosphere can be formed by spraying an inert gas such as a nitrogen gas to the surface which is to be irradiated with the laser light 132.

The irradiation under the inert atmosphere such as nitrogen has higher effect of improving the flatness of the single crystal semiconductor layer 118 than the irradiation under the air atmosphere. In addition, the inert atmosphere has higher effect of suppressing generation of cracks and ridges than the air atmosphere, and the energy density range applicable for the laser light 132 is widened. Note that the irradiation with the laser light 132 may be performed under a reduced-pressure atmosphere. When the irradiation with the laser light 132 is performed under the reduced-pressure atmosphere, the same effect as the effect of the irradiation under the inert atmosphere can be obtained.

Although the irradiation treatment with the laser light 132 is performed just after the thermal treatment for separation of the single crystal semiconductor layer 116 in this embodiment, one embodiment of the present invention is construed without being limited to this mode. Etching treatment may be performed after the thermal treatment for separation of the single crystal semiconductor layer 116, to remove a region where there are many defects in the surface of the single crystal semiconductor layer 116, and then the irradiation treatment with the laser light 132 may be performed. The flatness of the surface of the single crystal semiconductor layer 116 may be improved, and then the irradiation treatment with the laser light 132 may be performed. As the above-described etching treatment, either dry-etching or wet-etching can be used.

Further, although not described in this embodiment, a step of thinning the single crystal semiconductor layer 118 may be performed after the irradiation with the laser light 132. Thinning of the single crystal semiconductor layer 118 may be performed by one of dry-etching and wet-etching or a combination of both the etchings.

Through the above process, a good SOI substrate where stripe patters are reduced can be obtained.

Figure 2C:
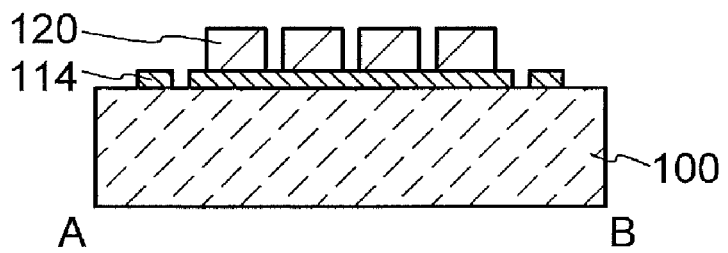
Figure 3B:
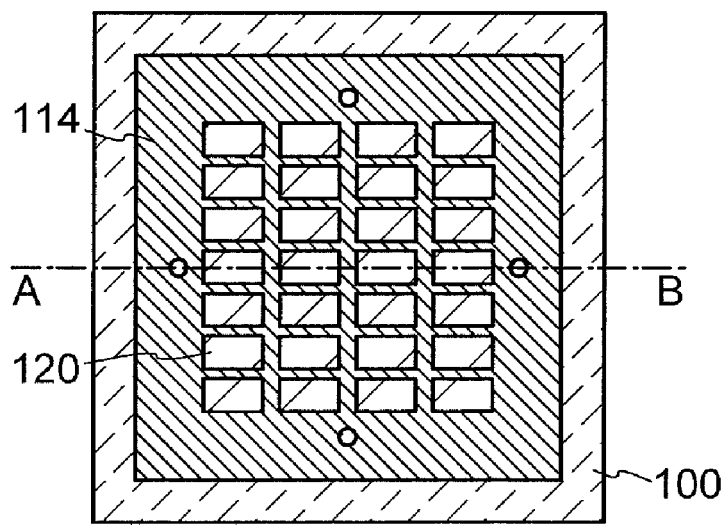

After that, in patterning the single crystal semiconductor layer 118 into an island-shaped semiconductor layer 120, the single crystal semiconductor layer 118 in the region corresponding to the above-described periphery (the vicinity of the region where the depression 140 (or the projection) is formed) is removed (see FIGS. 2C and 3B). FIG. 2C corresponds to a cross section along line A-B in FIG. 3B. The reason why the single crystal semiconductor layer 118 is removed in the region corresponding to the periphery is because the possibility that pealing would occur is high in that region due to the shortage of the bonding strength. The edge of surface of the single crystal semiconductor substrate has a curved surface-shape (called Edge Roll-Off) resulting from the surface polishing treatment, so that the region is in short of the bonding strength.

After that, a semiconductor device is manufactured using the above-described island-shaped semiconductor layer. A specific method for manufacturing the semiconductor device will be described in detail in an embodiment below.

According to one embodiment of the present invention, in manufacturing an SOI substrate by bonding, a depression or a projection is provided in a part (the periphery) of a surface which is to be bonded, to form a region in which the bonding is not performed by design. In this manner, generation of stress caused by expansion or contraction of a substrate due to thermal treatment can be suppressed, thereby suppressing generation of a stripe pattern (unevenness) in a single crystal semiconductor layer.

When a semiconductor element is formed, the semiconductor layer in the region where the depression or the projection is provided is removed, so that the adverse effect of the depression or the projection on a semiconductor device can be suppressed.

Further, as described in this embodiment, according to one embodiment of the present invention, the depression 140 is formed in the region of the surface of the insulating layer 114, corresponding to the periphery of the single crystal semiconductor substrate 110, so that a region in which the base substrate 100 and the single crystal semiconductor substrate 110 are not bonded to each other is formed by design (see FIG. 1C), whereby separation is triggered when the single crystal semiconductor substrate 110 is separated at the fragile region 120. In this manner, surface roughness of the single crystal semiconductor layer 116 formed by the separation can be suppressed.

Although four depressions (or projections) are provided in the periphery of the single crystal semiconductor layer in this embodiment (see FIG. 3A), one embodiment of the present invention is not limited thereto. The number of depressions (or projections), position thereof, and the like can be set as appropriate. For example, depressions (or projections) can be formed in regions corresponding to corners of the single crystal semiconductor layer. Further, in considering the improvement of the yield of manufacturing semiconductor devices, it is very preferable to form the depressions (or projections) in the region to be later removed (see FIG. 3B).

Note that the structure described in this embodiment can be implemented by being combined as appropriate with any other structure described in the other embodiments in this specification.

[Embodiment 2]

In this embodiment, another example of the manufacturing method of a semiconductor substrate (SOI substrate) and a semiconductor device using the semiconductor substrate (SOI substrate) will be described with reference to drawings.

First, a base substrate 100 is prepared (see FIG. 4A). A detailed description of the base substrate 100 is omitted here because Embodiment 1 can be referred therefor.

Next, a nitrogen-containing layer 102 (for example, an insulating film containing nitrogen such as a silicon nitride film ($SiN_x$) or a silicon nitride oxide film ($SiN_xO_y$, x>y) is formed over the surface of the base substrate 100 (see FIG. 4B).

The nitrogen-containing layer 102 formed in this embodiment corresponds to a layer for the bonding of a single crystal semiconductor layer (a bonding layer). The nitrogen-containing layer 102 also functions as a barrier layer for preventing impurities such as sodium (Na) contained in the base substrate from being diffused into the single crystal semiconductor layer.

Since the nitrogen-containing layer 102 is used as the bonding layer in this embodiment as described above, the nitrogen-containing layer 102 is preferably formed to have a surface with a predetermined flatness. Specifically, the nitrogen-containing layer 102 is preferably formed to have a surface with an average surface roughness ($R_a$) of 0.5 nm or less and a root-mean-square surface roughness ($R_{ms}$) of 0.60 nm or less, more preferably, an average surface roughness of 0.35 nm or less and a root-mean-square surface roughness of 0.45 nm or less. The thickness thereof is preferably in the range of 10 nm to 200 nm, more preferably, 50 nm to 100 nm. With the surface flatness improved as described above, the bonding defect of the single crystal semiconductor layer can be prevented.

Next, a single crystal semiconductor substrate 110 is prepared (see FIG. 4C). In this embodiment, the following step of the single crystal semiconductor substrate 110 is performed after the above-described step of the base substrate 100; however, this is for convenience of explanation and one embodiment of the present invention is construed without being limited to this order. Details of the single crystal semiconductor substrate 110 are omitted here because Embodiment 1 can be referred to.

From the point of view of removal of contaminants, it is preferable that the surface of the single crystal semiconductor substrate 110 be cleaned by a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), or the like. Diluted hydrogen fluoride and ozone water may be discharged alternately to clean the surface of the single crystal semiconductor substrate 110.

Next, an oxide film 115 is provided on the surface of the single crystal semiconductor substrate 110.

As the oxide film 115, a single layer of a silicon oxide film, a silicon oxynitride film, or the like, or a stacked layer thereof can be used. As examples of the method for manufacturing the oxide film 115, a thermal oxidation method, a CVD method, a sputtering method, and the like are given. In the case where the oxide film 115 is formed using a CVD method, it is preferable to form a silicon oxide film using organosilane such as tetraethoxysilane (abbreviation: TEOS, chemical formula: $Si(OC_2H_5)_4$) in view of the productivity.

In this embodiment, thermal oxidation treatment is performed on the single crystal semiconductor substrate 110 to form the oxide film 115 ($SiO_x$ film in this embodiment). The thermal oxidation treatment is preferably performed in an oxidizing atmosphere to which halogen is added.

For example, thermal oxidation treatment is performed on the single crystal semiconductor substrate 110 in an oxidizing atmosphere to which chlorine (Cl) is added, whereby the oxide film 115 is formed through chlorine oxidation. In that case, the oxide film 115 is a film containing a chlorine atom.

The chlorine atom contained in the oxide film 115 brings distortion in the oxide film 115. As a result, the moisture absorption rate of the oxide film 115 is improved, so that the moisture diffusion rate is improved. That is, moisture which may exist on the surface of the oxide film 115 can be absorbed quickly into the oxide film 115 and diffused, so that the bonding defect due to moisture can be reduced.

Further, with the chlorine atom contained in the oxide film 115, heavy metal (such as Fe, Cr, Ni, or Mo) that is an extrinsic impurity can be captured, so that contamination of the single crystal semiconductor substrate 110 can be prevented. Moreover, after the bonding to the base substrate, impurities such as Na from the base substrate are fixed, so that contamination of the single crystal semiconductor substrate 110 can be prevented.

Note that the halogen atom contained in the oxide film 115 is not limited to a chlorine atom. A fluorine atom may be contained in the oxide film 115. As examples of the method for fluorine oxidation of the surface of the single crystal semiconductor substrate 110, a method in which the single crystal semiconductor substrate 110 is soaked in an HF solution and then thermal oxidation treatment is performed in an oxidizing atmosphere, a method in which $NF_3$ is added to an oxidizing atmosphere to perform thermal oxidation treatment, and the like are given.

Next, the single crystal semiconductor substrate 110 is irradiated with ions 130 accelerated by an electrical field, thereby forming a fragile region 112 where the crystal structure is damaged, at a predetermined depth in the single crystal semiconductor substrate 110 (see FIG. 4D). The depth at which the fragile region 112 is formed can be controlled by the kinetic energy, mass, charge, incidence angle of the ions 130, and the like. The fragile region 112 is formed at approximately the same depth as the average penetration depth of the ions 130. Therefore, the thickness of a single crystal semiconductor layer to be separated from the single crystal semiconductor substrate 110 can be controlled by the depth at which the ions 130 are added. For example, the average penetration depth may be controlled such that the thickness of the single crystal semiconductor layer is about greater than or equal to 10 nm and less than or equal to 500 nm, preferably, greater than or equal to 50 nm and less than or equal to 200 nm.

The above-described irradiation treatment with ions can be performed by using ion-doping equipment or ion-implantation equipment. As a typical example of the ion-doping equipment, there is non-mass-separation type equipment in which plasma excitation of a process gas is performed and an object to be processed is irradiated with all kinds of ion species generated. This equipment irradiates the object to be processed with ion species in plasma without mass separation. In contrast, the ion-implantation equipment is mass-separation type equipment. The ion-implantation equipment performs mass separation of ion species of plasma and irradiates the object to be processed with ion species having predetermined masses.

In this embodiment, an example in which hydrogen is added to the single crystal semiconductor substrate 110 with the use of ion-doping equipment is described. A gas containing hydrogen is used as a source gas. As for ions for the irradiation, it is preferable that the proportion of $H_3^+$ is as high as possible. In specific, it is preferable that the proportion of $H_3^+$ is greater than or equal to 50% (more preferably greater than or equal to 80%) with respect to the total amount of $H^+$, $H_2^+$, and $H_3^+$. Increase in the proportion of $H_3^+$ can improve the efficiency of the ion irradiation.

Note that heavy metal may also be added when the ion-doping equipment is used; however, the ion irradiation is performed through the oxide film 115 containing a halogen atom, so that contamination of the single crystal semiconductor substrate 110 due to the heavy metal can be prevented as described above.

Next, a depression 140 (or a projection) is formed in a region of the surface of the oxide film 115, the region corresponding to the periphery of the single crystal semiconductor substrate 110, so that a portion where the base substrate 100 and the single crystal semiconductor substrate 110 are not bonded to each other is formed by design (see FIG. 4E). Accordingly, stress caused by thermal treatment at the time of the bonding can be suppressed, thereby suppressing generation of a stripe pattern (unevenness) in a single crystal semiconductor layer.

Note that although the stress is suppressed by the depression 140 formed in the oxide film 115 according to this embodiment, one embodiment of the present invention is construed without being limited to this structure. A projection may be formed instead of the depression. As examples of the method for forming the depression, patterning after the formation of the oxide film 115, marking by laser light irradiation, and the like can be given. As examples of the method for forming the projection, patterning after the formation of the oxide film 115, bonding of a particle with an appropriate size on the surface of the oxide film 115, and the like can be given.

Further, although the depression 140 is provided on the single crystal semiconductor substrate 110 (the oxide film 115) according to this embodiment, one embodiment of the present invention is construed without being limited to this structure. The depression or projection may be provided on the corresponding region of the base substrate 100 (the nitrogen-containing layer 102).

Next, the surface of the base substrate 100 is disposed to face the surface of the single crystal semiconductor substrate 110, and the surface of the nitrogen-containing layer 102 and the surface of the oxide film 115 are bonded with each other (see FIG. 4F).

Here, the base substrate 100 is bonded firmly to the single crystal semiconductor substrate 110 with the nitrogen-containing layer 102 and the oxide film 115 interposed therebetween, and then, a pressure which is greater than or equal to 1 N/cm$^2$ and less than or equal to 500 N/cm$^2$, preferably, a pressure which is greater than or equal to 11 N/cm$^2$ and less than or equal to 20 N/cm$^2$ is applied to one portion of the single crystal semiconductor substrate 110. Accordingly, the nitrogen-containing layer 102 and the oxide film 115 starts bonding to each other from the portion to which the pressure is applied, which forms a bond spontaneously therebetween and the bond expands over the surface. Vander Waals' force or a hydrogen bond acts on this bonding step and this bonding step can be performed at normal temperature.

Note that before the bonding of the base substrate 100 and the single crystal semiconductor substrate 110, it is preferable to perform surface treatment on a surface at which the bonding is performed, that is, the surfaces of the oxide film 115 provided on the single crystal semiconductor substrate 110 and the nitrogen-containing layer 102 formed over the base substrate 100 in this embodiment. Surface treatment can improve the bonding strength between the nitrogen-containing layer 102 and the oxide film 115.

As examples of the surface treatment, wet treatment, dry treatment, and combination of wet treatment and dry treatment can be given. Different wet treatments or different dry treatments may be combined to be performed.

As examples of the wet treatment, ozone treatment using ozone water (ozone water cleaning), megasonic cleaning, two-fluid cleaning (method in which functional water such as pure water or hydrogenated water and a carrier gas such as nitrogen are sprayed together), and the like can be given. As examples of the dry treatment, ultraviolet treatment, ozone treatment, plasma treatment, plasma treatment with bias application, radical treatment, and the like can be given. The above-described surface treatment on an object (a single crystal semiconductor substrate, an insulating layer formed on a single crystal semiconductor substrate, a support substrate, or an insulating layer formed on a support substrate) has an effect on the surface of the object to improve the hydrophilicity and cleanliness. As a result, the bonding strength between the substrates can be improved.

The wet treatment is effective for removal of macro dust and the like bonded on the surface of the object; the dry treatment is effective for removal or decomposition of micro dust and the like such as an organic substance bonded on the surface of the object. The case in which the dry treatment such as ultraviolet treatment is performed and then the wet treatment such as cleaning is performed is preferable because the surface of the object can be made clean and hydrophilic and generation of watermarks in the surface of the object can be suppressed.

As the dry treatment, it is referable to perform surface treatment using ozone or oxygen in an active state such as singlet oxygen. Ozone or oxygen in an active state such as singlet oxygen enables organic substances bonded on the surface of the object to be removed or decomposed effectively. Further, the treatment using ozone or oxygen in an active state such as singlet oxygen may be combined with treatment using ultraviolet light having wavelengths less than 200 nm, so that the organic substances bonded on the surface of the object can be removed more effectively. Specific description thereof will be made below.

For example, irradiation with ultraviolet light under the atmosphere containing oxygen is performed to perform the surface treatment of the object. Irradiation with ultraviolet light having wavelengths less than 200 nm and ultraviolet light having wavelengths greater than or equal to 200 nm under the atmosphere containing oxygen may be performed, so that ozone and singlet oxygen can be generated. Alternatively, irradiation with ultraviolet light having wavelengths less than 180 nm may be performed, so that ozone and singlet oxygen can be generated.

An example of the reaction which is caused by the irradiation with ultraviolet light having wavelengths less than 200 nm and ultraviolet light having wavelengths greater than or equal to 200 nm under the atmosphere containing oxygen is described below.

   (1)

   (2)

   (3)

In the reaction formula (1), irradiation with light (hv) having wavelengths ($\lambda_1$ nm) less than 200 nm under the atmosphere containing oxygen ($O_2$) is performed to generate oxygen atoms in the ground state ($O(^3P)$). Next, in the reaction formula (2), the oxygen atom in the ground state ($O(^3P)$) and oxygen ($O_2$) react with each other to generate ozone ($O_3$). Then, in the reaction formula (3), irradiation with light having wavelengths ($\lambda_2$ nm) greater than or equal to 200 nm under the atmosphere containing generated ozone ($O_3$) is performed to generate singlet oxygen in an excited state ($O(^1D)$). Under the atmosphere containing oxygen, irradiation with ultraviolet light having wavelengths less than 200 nm is performed to generate ozone, and irradiation with ultraviolet light having wavelengths greater than or equal to 200 nm is performed to decompose ozone, so that singlet oxygen is generated. The above-described surface treatment can be performed by, for example, irradiation with a low-pressure mercury lamp ($\lambda_1$=185 nm, $\lambda_2$=254 nm) under the atmosphere containing oxygen.

An example of the reaction which is caused by the irradiation with ultraviolet light having wavelengths less than 180 nm under the atmosphere containing oxygen is described below.

   (4)

   (5)

   (6)

In the reaction formula (4), irradiation with light having wavelengths ($\lambda_3$ nm) less than 180 nm under the atmosphere containing oxygen ($O_2$) is performed to generate singlet oxygen in an excited state ($O(^1D)$) and an oxygen atom in the ground state ($O(^3P)$). Next, in the reaction formula (5), the oxygen atom in the ground state ($O(^3P)$) and oxygen ($O_2$) react with each other to generate ozone ($O_3$). Then, in the reaction formula (6), irradiation with light having wavelengths ($\lambda_3$ nm) less than 180 nm under the atmosphere containing generated ozone ($O_3$) is performed to generate singlet oxygen in an excited state and oxygen. Under the atmosphere containing oxygen, irradiation with ultraviolet light having wavelengths less than 180 nm is performed to generate ozone and to decompose ozone or oxygen, so that singlet oxygen is generated. The above-described surface treatment can be performed by, for example, irradiation with a Xe excimer UV lamp under the atmosphere containing oxygen.

Chemical bond of an organic substance bonded on the surface of an object is cut by the ultraviolet light having wavelengths less than 200 nm, and an organic substance or an organic substance in which the chemical bond is cut which is bonded on the surface of the object can be oxidative-decomposed by ozone or singlet oxygen to be removed. With the above-described surface treatment, the hydrophilicity and cleanliness of the surface of the object can be improved, so that the nitrogen-containing layer 102 and the oxide film 115 can be bonded sufficiently.

Further, after the bonding of the nitrogen-containing layer 102 and the oxide film 115, it is preferable to perform thermal treatment for increasing the bonding strength. The temperature of this thermal treatment is set to a temperature at which separation is not performed at the fragile region 112 (for example, a temperature which is greater than or equal to normal temperature and less than 400° C.). Alternatively, bonding of the nitrogen-containing layer 102 and the oxide film 115 may be performed while heating them at temperatures in this range. For this heat treatment, a diffusion furnace, a heating furnace such as a resistance heating furnace, a rapid thermal annealing (RTA) apparatus, a microwave heating apparatus, or the like can be used.

Figure 5A:
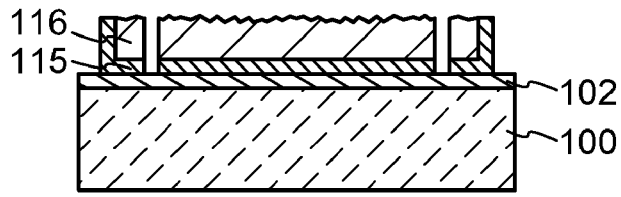
FIGS. 5A to 5D are cross-sectional views showing an example of the manufacturing method of an SOI substrate and a semiconductor device.

Next, separation of the single crystal semiconductor substrate 110 is performed at the fragile region 112 by thermal treatment, so that a single crystal semiconductor layer 116 is provided over the base substrate 100 with the nitrogen-containing layer 102 and the oxide film 115 interposed therebetween (see FIGS. 4G and 5A).

With the thermal treatment, an added element is separated out in a microvoid formed in the fragile region 112, so that the internal pressure is increased. The increased pressure causes a crack in the fragile region 112, so that the single crystal semiconductor substrate 110 is separated along the fragile region 112. Since the insulating layer 114 is bonded to the base substrate 100, the single crystal semiconductor layer 116 separated from the single crystal semiconductor substrate 110 remains over the base substrate 100. Note that since the bonding is not performed in the depression 140 (or the projection), the single crystal semiconductor layer 116 is not formed in the region corresponding to the depression 140, of the base substrate 100, by which adverse effect of stress on the film due to the above-described thermal treatment can be lessened, thereby suppressing generation of a stripe pattern (unevenness) in the semiconductor layer.

Figure 5B:
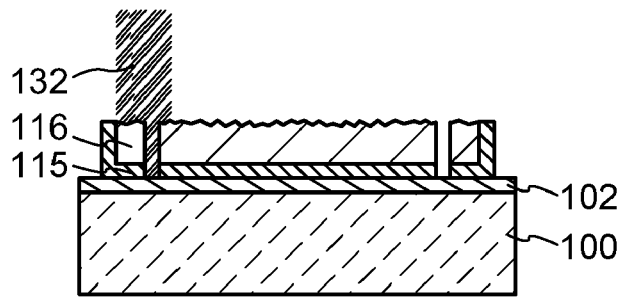
Figure 5C:
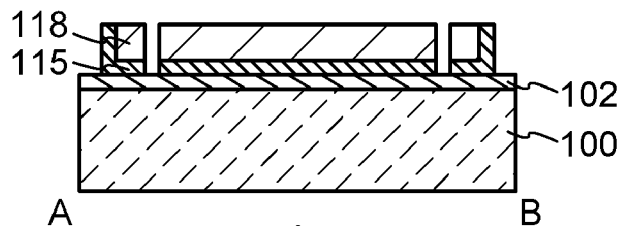
Figure 6A:
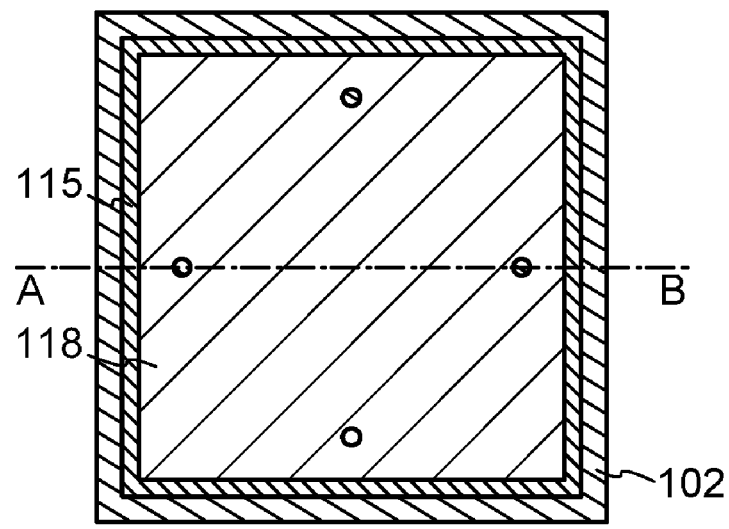
FIGS. 6A and 6B are plan views showing examples of the manufacturing method of an SOI substrate and a semiconductor device.

Next, the surface of the single crystal semiconductor layer 116 is irradiated with laser light 132, thereby forming a single crystal semiconductor layer 118 in which the flatness of the surface is improved and the number of defects is reduced (see FIGS. 5B and 5C and 6A). FIG. 5C corresponds to a cross section taken along A-B in FIG. 6A. The irradiation atmosphere of the laser light 132 is not limited particularly, but an inert atmosphere or a reduced-pressure atmosphere enables the surface flatness of the single crystal semiconductor layer 118 to be improved as compared to the case of the air atmosphere.

Details of the laser light irradiation treatment are omitted here because Embodiment 1 can be referred to.

Note that although the irradiation treatment with the laser light 132 is performed just after the thermal treatment for separation of the single crystal semiconductor layer 116 in this embodiment, one embodiment of the present invention is construed without being limited to this mode. Etching treatment may be performed after the thermal treatment for separation of the single crystal semiconductor layer 116, to remove a region where there are many defects in the surface of the single crystal semiconductor layer 116, and then the irradiation treatment with the laser light 132 may be performed. The flatness of the surface of the single crystal semiconductor layer 116 may be improved, and then the irradiation treatment with the laser light 132 may be performed. As the above-described etching treatment, either wet-etching or dry-etching can be used.

Further, although not described in this embodiment, a step of thinning the single crystal semiconductor layer 118 may be performed after the irradiation with the laser light 132. Thinning of the single crystal semiconductor layer 118 may be performed by one of dry-etching and wet-etching or a combination of both the etchings.

Through the above process, a good SOI substrate where a stripe patter (unevenness) is reduced can be obtained.

Figure 5D:
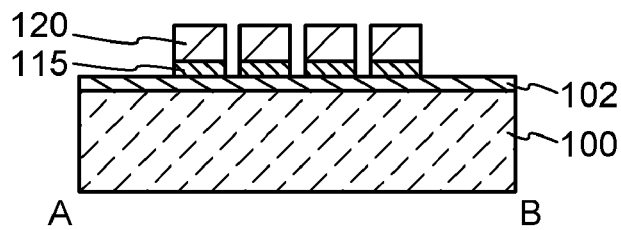
Figure 6B:
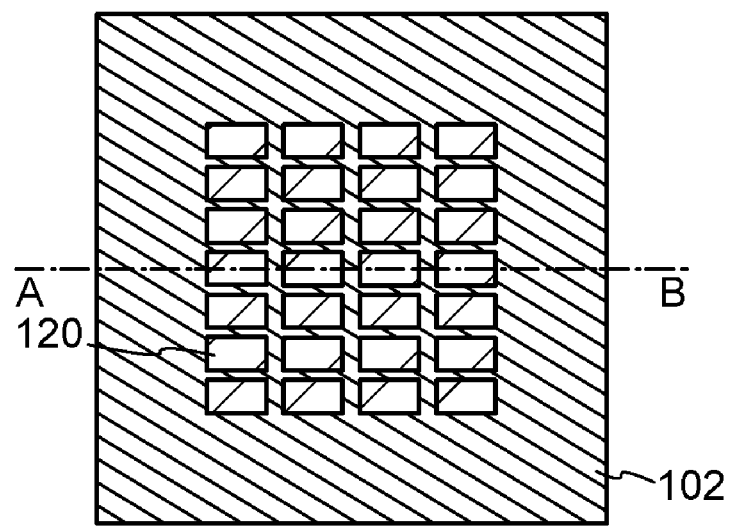

After that, in patterning the single crystal semiconductor layer 118 into an island-shaped semiconductor layer 120, the single crystal semiconductor layer 118 in the region corresponding to the above-described periphery (the vicinity of the region where the depression 140 (or the projection) is formed) is removed (see FIGS. 5D and 6B). FIG. 5D corresponds to a cross section along line A-B in FIG. 6B. The reason why the single crystal semiconductor layer 118 is removed in the region corresponding to the periphery is because the possibility that pealing would occur is high in that region due to the shortage of the bonding strength. The edge of surface of the single crystal semiconductor substrate has a curved surface-shape (called Edge Roll-Off) resulting from the surface polishing treatment, so that the region is in short of the bonding strength.

After that, a semiconductor device is manufactured using the above-described island-shaped semiconductor layer. A specific method for manufacturing the semiconductor device will be described in detail in an embodiment below.

According to one embodiment of the present invention, in manufacturing an SOI substrate by bonding, a depression or a projection is provided in a part (the periphery) of a surface which is to be bonded, to form a region in which the bonding is not performed by design. In this manner, generation of stress caused by expansion or contraction of a substrate due to thermal treatment can be suppressed, thereby suppressing generation of a stripe pattern (unevenness) in a single crystal semiconductor layer.

When a semiconductor element is formed, the semiconductor layer in the region where the depression or the projection is provided is removed, so that the adverse effect of the depression or the projection on a semiconductor device can be suppressed.

Note that although four depressions (or projections) are provided in the periphery of the single crystal semiconductor layer in this embodiment (see FIG. 6A), one embodiment of the present invention is not limited thereto. The number of depressions (or projections), position thereof, and the like can be set as appropriate. For example, depressions (or projections) can be formed in regions corresponding to corners of the single crystal semiconductor layer. Further, in considering the improvement of the yield of manufacturing semiconductor devices, it is very preferable to form the depressions (or projections) in the region to be later removed (see FIG. 6B).

Note that the structure described in this embodiment can be implemented by being combined as appropriate with any other structure described in the other embodiments in this specification.

[Embodiment 3]

In this embodiment, details of the method for manufacturing the semiconductor device described in the above-described embodiment will be described with reference to FIGS. 7A to 7D, 8A to 8D, and 9A and 9B. Here, a method for manufacturing a semiconductor device including a plurality of transistors, as an example of the semiconductor device, is described. Note that various kinds of semiconductor devices can be formed with the use of transistors described below in combination.

Figure 7A:
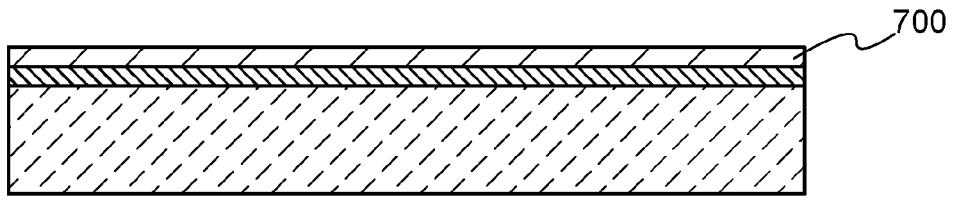
FIGS. 7A to 7D are cross-sectional views showing an example of the manufacturing method of a semiconductor device (transistor).

FIG. 7A is a cross-sectional view showing a part of the semiconductor substrate manufactured according to Embodiment 1 (see FIG. 2B and the like). In this embodiment, although description is made on the case where the semiconductor device is manufactured using the semiconductor substrate manufactured according to Embodiment 1, the semiconductor substrate manufactured according to Embodiment 2 may be used as well.

To control threshold voltages of TFTs, a p-type impurity element such as boron, aluminum, or gallium or an n-type impurity element such as phosphorus or arsenic may be added to a semiconductor layer 700 (which corresponds to the single crystal semiconductor layer 118 in FIG. 2B). A region where the impurity element is added and the kind of the impurity element can be changed as appropriate. For example, a p-type impurity element is added to a formation region of an n-channel TFT, and an n-type impurity element is added to a formation region of a p-channel TFT. In adding the above-described impurity elements, the dosage may be about greater than or equal to $1\times10^{15}$ atoms/cm$^2$ and less than or equal to $1\times10^{17}$ atoms/cm$^2$.

Figure 7B:
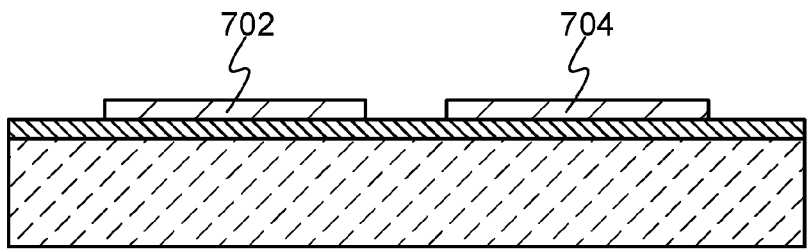

Then, the semiconductor layer 700 is separated into island shapes to form a semiconductor film 702 and a semiconductor film 704 (see FIG. 7B). In this time, the single crystal semiconductor layer 118 in the region corresponding to the periphery thereof (the vicinity of the region where the depression or projection is formed) is removed (see FIG. 2C and the like).

Figure 7C:
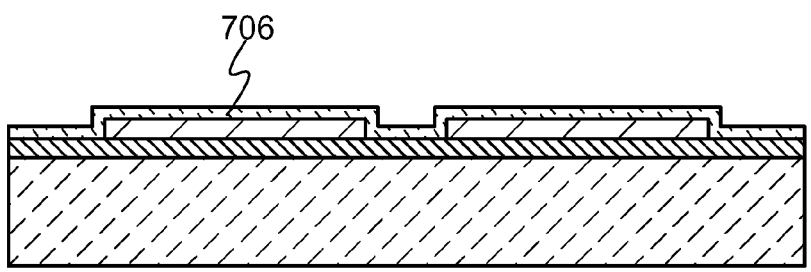

Next, a gate insulating film 706 is formed so as to cover the semiconductor films 702 and 704 (see FIG. 7C). Here, a single layer of a silicon oxide film is formed by a plasma CVD method. Alternatively, as the gate insulating film 706, a single layer or a stacked layer using a film including silicon oxynitride, silicon nitride oxide, silicon nitride, hafnium oxide, aluminum oxide, tantalum oxide, or the like may be formed.

As a manufacturing method other than a plasma CVD method, a sputtering method or a method of oxidizing or nitriding by high density plasma treatment can be given. High-density plasma treatment is performed using, for example, a mixed gas of a rare gas such as helium, argon, krypton, or xenon and a gas such as oxygen, nitrogen oxide, ammonia, nitrogen, or hydrogen. In that case, by exciting plasma by introduction of microwaves, plasma with a low electron temperature and high density can be generated. The surfaces of the semiconductor films are oxidized or nitrided by oxygen radicals (OH radicals may be included) or nitrogen radicals (NH radicals may be included) which are produced by such high-density plasma, whereby an insulating film with a thickness of greater than or equal to 1 nm and less than or equal to 20 nm, preferably, greater than or equal to 2 nm and less than or equal to 10 nm is formed so as to be in contact with the semiconductor films.

Oxidation or nitridation of the semiconductor films by the above-described high-density plasma treatment is a solid-phase reaction, and therefore, the interface state density between the gate insulating film 706 and each of the semiconductor films 702 and 704 can be extremely decreased. Further, the semiconductor films are directly oxidized or nitrided by the high-density plasma treatment, whereby variation in thickness of the insulating film to be formed can be suppressed. Since the semiconductor films are single crystal films, even when the surfaces of the semiconductor films are oxidized by a solid-phase reaction by using the high-density plasma treatment, a gate insulating film with high uniformity and low interface state density can be formed. The insulating film formed by the high-density plasma treatment is used for part of or the entire gate insulating film of a transistor as described above, whereby variation in characteristic of the transistors can be suppressed.

Alternatively, the gate insulating film 706 may be formed by thermally oxidizing the semiconductor films 702 and 704.

In the case of using the thermal oxidation as described above, it is necessary to use a glass substrate having a certain degree of heat resistance.

Further alternatively, a gate insulating film containing hydrogen may be formed as the gate insulating film 706, and then heat treatment at a temperature higher than or equal to 350° C. and lower than or equal to 450° C. may be performed to disperse hydrogen contained in the gate insulating film 706 into the semiconductor films 702 and 704. In that case, silicon nitride or silicon nitride oxide formed by a plasma CVD method can be used as the gate insulating film 706. The process temperature may be set to lower than or equal to 350° C. In this manner, by supplying hydrogen to the semiconductor films 702 and 704, defects in the semiconductor films 702 and 704, at an interface between the gate insulating film 706 and the semiconductor film 702, and at an interface between the gate insulating film 706 and the semiconductor film 704 can be effectively reduced.

Figure 7D:
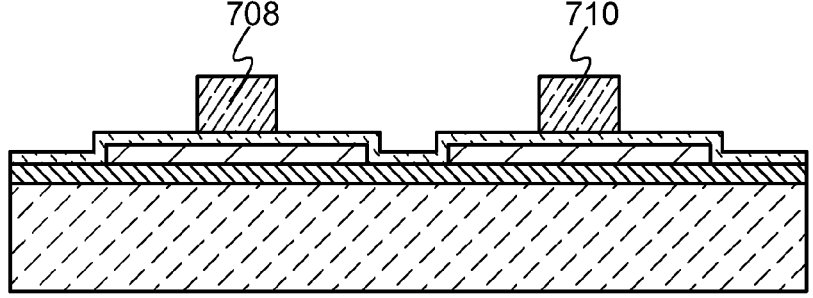

Next, a conductive film is formed over the gate insulating film 706, and then the conductive film is processed (patterned) into a predetermined shape, so that an electrode 708 and an electrode 710 are formed over the semiconductor film 702 and the semiconductor film 704 respectively (see FIG. 7D). The conductive film can be formed by a CVD method, a sputtering method, or the like. The conductive film can be formed using a material such as tantalum (Ta), tungsten (W), titanium (Ti), molybdenum (Mo), aluminum (Al), copper (Cu), chromium (Cr), or niobium (Nb). An alloy material containing the above-described metal as a main component or a compound containing the above-described metal may be used as well. Alternatively, a semiconductor material such as polycrystalline silicon, which is obtained by doping a semiconductor with an impurity element that imparts a conductivity type, or the like may be used.

Although a single-layer conductive film is used as each of the electrodes 708 and 710 in this embodiment, the semiconductor device according to one embodiment of the present invention is not limited to the structure. Each of the electrodes 408 and 710 may be formed of a plurality of conductive films which is stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure of a molybdenum film, an aluminum film, and a molybdenum film; a stacked-layer structure of a titanium film, an aluminum film, and a titanium film; or the like may be used.

Note that a mask used for forming the electrodes 708 and 710 may be formed using a material such as silicon oxide or silicon nitride oxide. In that case, a step of forming a mask by patterning a silicon oxide film, a silicon nitride oxide film, or the like is additionally needed; however, the amount of thickness reduction of the mask in etching is smaller than that of the resist material, so that the electrodes 708 and 710 with a more precise shape can be formed. Alternatively, the electrodes 708 and 710 may be formed to have an appropriate pattern by a droplet discharge method without using a mask. Here, a droplet discharge method refers to a method in which droplets containing a predetermined composition are discharged or ejected to form a predetermined pattern, and includes an ink-jet method in its category.

Alternatively, the electrodes 708 and 710 can be formed by etching the conductive film to have a desired tapered shape by an inductively coupled plasma (ICP) etching method where the etching conditions (e.g., the amount of electric energy applied to a coiled electrode, the amount of electric energy applied to an electrode on the substrate side, and the electrode temperature on the substrate side) are controlled as appropriate. The tapered shape can be adjusted by the shape of the mask. As an etching gas, a chlorine-based gas such as chlorine, boron chloride, silicon chloride, or carbon tetrachloride; a fluorine-based gas such as carbon tetrafluoride, sulfur fluoride, or nitrogen fluoride; oxygen; or the like can be used as appropriate.

Figure 8A:
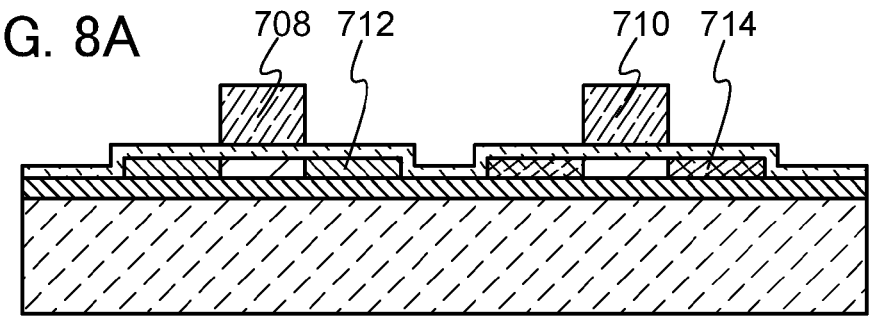
FIGS. 8A to 8D are cross-sectional views showing an example of the manufacturing method of a semiconductor device (transistor).

Next, an impurity element which imparts one conductivity type is added to the semiconductor films 702 and 704 by using the electrodes 708 and 710 as masks (see FIG. 8A). In this embodiment, an impurity element which imparts n-type conductivity (e.g., phosphorus or arsenic) is added to the semiconductor film 702, and an impurity element which imparts p-type conductivity (e.g., boron) is added to the semiconductor film 704. Note that when the impurity element which imparts n-type conductivity is added to the semiconductor film 702, the semiconductor film 704 to which the impurity element which imparts p-type conductivity is added is covered with a mask or the like so that the impurity element which imparts n-type conductivity is added selectively. Further, when the impurity element which imparts p-type conductivity is added to the semiconductor film 704, the semiconductor film 702 to which the impurity element which imparts n-type conductivity is added is covered with a mask or the like so that the impurity element which imparts p-type conductivity is added selectively. Alternatively, one of an impurity element which imparts p-type conductivity and an impurity element which imparts n-type conductivity may be added to the semiconductor films 702 and 704, and then the other of the impurity element which imparts p-type conductivity and the impurity element which imparts n-type conductivity may be added to one of the semiconductor films 702 and 704. By the addition of the impurity elements, an impurity region 712 and an impurity region 714 are formed in the semiconductor film 702 and the semiconductor film 704, respectively.

Figure 8B:
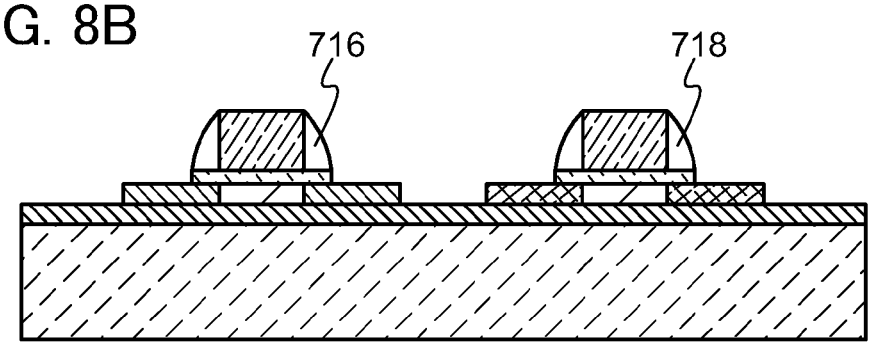

Next, a sidewall 716 is formed on the side surface of the electrode 708, and a sidewall 718 is formed on the side surface of the electrode 710 (see FIG. 8B). The sidewalls 716 and 718 can be formed by, for example, newly forming an insulating film so as to cover the gate insulating film 706 and the electrodes 708 and 710 and by partially etching the insulating film by anisotropic etching mainly in a perpendicular direction to an object to be etched. Note that the gate insulating film 706 may also be etched partially by the anisotropic etching described above. As for the insulating film forming the sidewalls 716 and 718, a single layer or a stacked layer using a film containing silicon, silicon oxide, silicon nitride, silicon oxynitride, silicon nitride oxide, an organic material, or the like may be formed. In this embodiment, a 100-nm-thick silicon oxide film is formed by a plasma CVD method. As an etching gas, a mixed gas of $CHF_3$ and helium can be used. Note that the process for forming the sidewalls 716 and 718 are not limited to this process described above.

Figure 8C:
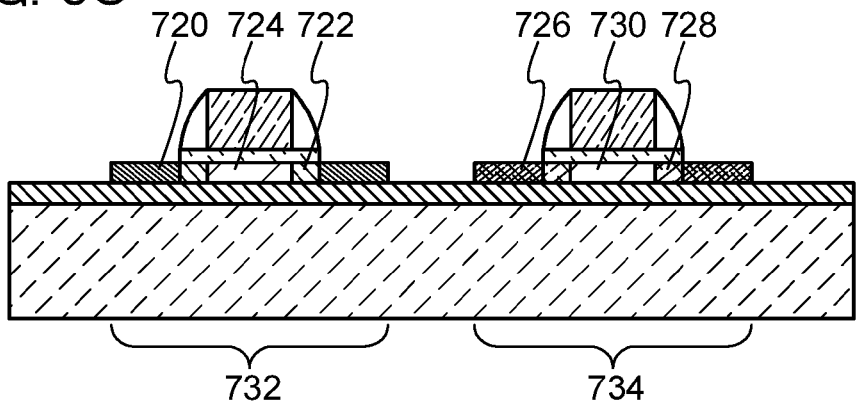

Next, an impurity element which imparts one conductivity type is added to the semiconductor films 702 and 704 by using the gate insulating film 706, the electrodes 708 and 710, and the sidewalls 716 and 718 as masks (see FIG. 8C). Note that the impurity element which imparts the same conductivity type as the impurity element which has been added to the semiconductor films 702 and 704 in the previous step is added to the semiconductor films 702 and 704 at a higher concentration. When the impurity element which imparts n-type conductivity is added to the semiconductor film 702, the semiconductor film 704 to which the p-type impurity element is added is covered with a mask or the like so that the impurity element which imparts n-type conductivity is added selectively. Further, when the impurity element which imparts p-type conductivity is added to the semiconductor film 704, the semiconductor film 702 to which the impurity element which imparts n-type conductivity is added is covered with a mask or the like so that the impurity element which imparts p-type conductivity is added selectively.

In addition, by the above-described addition of the impurity elements, a pair of high-concentration impurity regions 720, a pair of low-concentration impurity regions 722, and a channel formation region 724 are formed in the semiconductor film 702. In addition, by the above-described addition of the impurity elements, a pair of high-concentration impurity regions 726, a pair of low-concentration impurity regions 728, and a channel formation region 730 are formed in the semiconductor film 704. The high-concentration impurity regions 720 and the high-concentration impurity regions 726 each serve as a source or a drain, and the low-concentration impurity regions 722 and the low-concentration impurity regions 728 each serve as an LDD (lightly doped drain) region.

Note that the sidewall 716 formed over the semiconductor film 702 and the sidewall 718 formed over the semiconductor film 704 may be formed so as to have the same length in a direction where carriers move (a direction parallel to a so-called channel length), or may be formed so as to have different lengths. It is preferable that the sidewall 718 over the semiconductor film 704 which is included in a p-channel transistor is larger than the sidewall 716 over the semiconductor film 702 which is included in an n-channel transistor. This is because boron which is added for forming a source and a drain in the p-channel transistor is easily diffused and a short channel effect is easily induced. By making the length of the sidewall 718 in the p-channel transistor larger than that of the sidewall 716 in the n-channel transistor, boron can be added to the source and the drain in the p-channel transistor at high concentration, and thus the resistance of the source and the drain can be reduced.

In order to further reduce the resistance of the source and the drain, a silicide layer may be formed by silicification of parts of the semiconductor film 702 and the semiconductor film 704. The silicification is performed by making a metal in contact with the semiconductor films and causing a reaction between the metal and silicon in the semiconductor films by heat treatment (for example, a GRTA method or an LRTA method). The silicide layer may be formed from cobalt silicide or nickel silicide. In the case where the semiconductor films 702 and 704 are thin, silicide reaction may proceed to bottoms of the semiconductor films 702 and 704. As a metal material used for silicification, the following can be given: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), or the like. Further, a silicide layer can also be formed by laser irradiation or the like.

Through the process described above, an n-channel transistor 732 and a p-channel transistor 734 are formed. Note that although a conductive film serving as a source electrode or a drain electrode is not formed in the stage shown in FIG. 8C, a structure including the conductive film serving as a source electrode or a drain electrode may be referred to as a transistor.

Figure 8D:
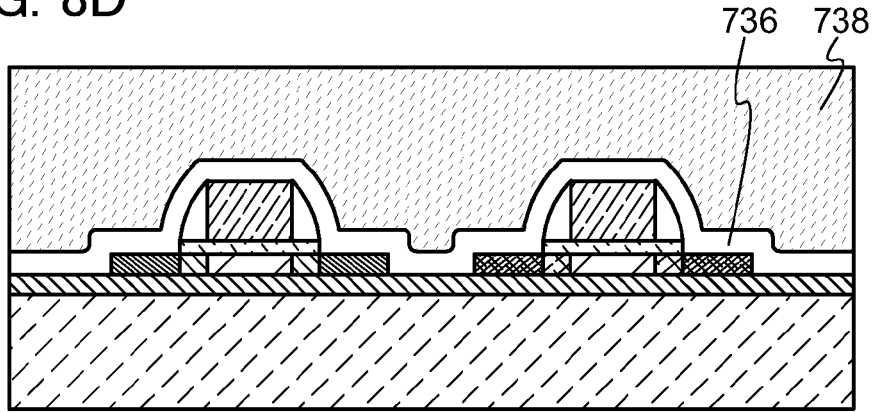

Next, an insulating film 736 is formed to cover the n-channel transistor 732 and the p-channel transistor 734 (see FIG. 8D). The insulating film 736 is not necessarily provided; however, the insulating film 736 can prevent impurities such as an alkali metal and an alkaline-earth metal from entering the n-channel transistor 732 and the p-channel transistor 734.

In specific, the insulating film 736 is preferably formed from a material such as silicon oxide, silicon nitride, silicon oxynitride, silicon nitride oxide, aluminum nitride, aluminum oxide, or the like. In this embodiment, a silicon nitride oxide film with a thickness of about 600 nm is used as the insulating film 736. In that case, the above-described hydrogenation step may be performed after the formation of the silicon nitride oxide film. Note that although the insulating film 736 has a single-layer structure in this embodiment, the insulating film 736 may have a stacked-layer structure. For example, in the case of the two-layer structure, a stacked structure of a silicon oxynitride film and a silicon nitride oxide film may be used.

Next, an insulating film 738 is formed over the insulating film 736 so as to cover the n-channel transistor 732 and the p-channel transistor 734. The insulating film 738 may be formed using an organic material having heat resistance, such as polyimide, acrylic, benzocyclobutene, polyamide, or epoxy. As well as such an organic material, it is also possible to use a low-dielectric constant material (a low-k material), a siloxane resin, silicon oxide, silicon nitride, silicon oxynitride, silicon nitride oxide, PSG (phosphosilicate glass), BPSG (borophosphosilicate glass), alumina, or the like. Here, the siloxane resin corresponds to a resin including a Si-O-Si bond which is formed using a siloxane-based material as a starting material. The siloxane resin may include, besides hydrogen, at least one of fluorine, an alkyl group, or aromatic hydrocarbon as a substituent. Note that the insulating film 738 may be formed by stacking a plurality of insulating films formed from any of the above materials.

For the formation of the insulating film 738, the following method can be used depending on the material of the insulating film 738: a CVD method, a sputtering method, an SOG method, a spin coating method, a dip coating method, a spray coating method, a droplet discharge method (e.g., an ink-jet method, screen printing, or offset printing), a doctor knife, a roll coater, a curtain coater, a knife coater, or the like.

Next, contact holes are formed in the insulating film 736 and the insulating film 738 so as to expose parts of the semiconductor film 702 and the semiconductor film 704. Then, conductive films 740 and 742 which are in contact with the semiconductor film 702 through the contact holes and conductive films 744 and 746 which are in contact with the semiconductor film 704 through the contact holes are formed (see FIG. 9A). The conductive films 704, 742, 744, and 746 function as source and drain electrodes of the transistors. Note that in this embodiment, as an etching gas for forming the contact holes, a mixed gas of $CHF_3$ and He is used; however, the etching gas is not limited thereto.

The conductive films 740, 742, 744, and 746 can be formed by a CVD method, a sputtering method, or the like. In specific, the conductive films 740, 742, 744, and 746 can be formed from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the above-described material as its main component or a compound containing the above-described material may be used. Further, each of the conductive films 740, 742, 744, and 746, either a single-layer structure or a stacked-layer structure may be used.

As an example of an alloy containing aluminum as its main component, an alloy containing aluminum as its main component and also containing nickel can be given. In addition, an alloy containing aluminum as its main component and also containing nickel and one or both of carbon and silicon can also be given as an example thereof. Aluminum and aluminum silicon (Al—Si), which have low resistance and are inexpensive, are suitable as a material for forming the conductive films 740, 742, 744, and 746. In particular, aluminum silicon is preferable because a hillock can be prevented from generating in resist baking at the time of patterning. Further, a material in which Cu is mixed into aluminum at about 0.5% may be used instead of silicon.

In the case where each of the conductive films 740, 742, 744, and 746 is formed to have a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be used, for example. Note that the barrier film refers to a film formed using titanium, a nitride of titanium, molybdenum, a nitride of molybdenum, or the like. By forming a conductive film so as to interpose an aluminum silicon film between the barrier films, generation of a hillock of aluminum or aluminum silicon can be further prevented. Further, in the case of forming the barrier film by using titanium that is a highly reducible element, a thin oxide film which would be formed on the semiconductor films 702 and 704 is reduced by the titanium contained in the barrier film, so that contact between the conductive films 740 and 742 and the semiconductor film 702 and contact between the conductive films 744 and 746 and the semiconductor film 704 can be increased. Further, it is also possible to stack a plurality of barrier films. In that case, for example, each of the conductive films 740, 742, 744, and 746 can be formed to have a five-layer structure including, for example, titanium, titanium nitride, aluminum silicon, titanium, and titanium nitride in this order from the bottom; or a stacked-layer structure including more than five layers.

As the conductive films 740, 742, 744, and 746, tungsten silicide formed by a chemical vapor deposition method using a $WF_6$ gas and a $SiH_4$ gas may be used. Alternatively, tungsten formed by hydrogen reduction of $WF_6$ may be used as the conductive films 740, 742, 744, and 746.

The conductive films 740 and 742 are connected to the high-concentration impurity regions 720 in the n-channel transistor 732. The conductive films 744 and 746 are connected to the high-concentration impurity regions 726 in the p-channel transistor 734.

Figure 9A:
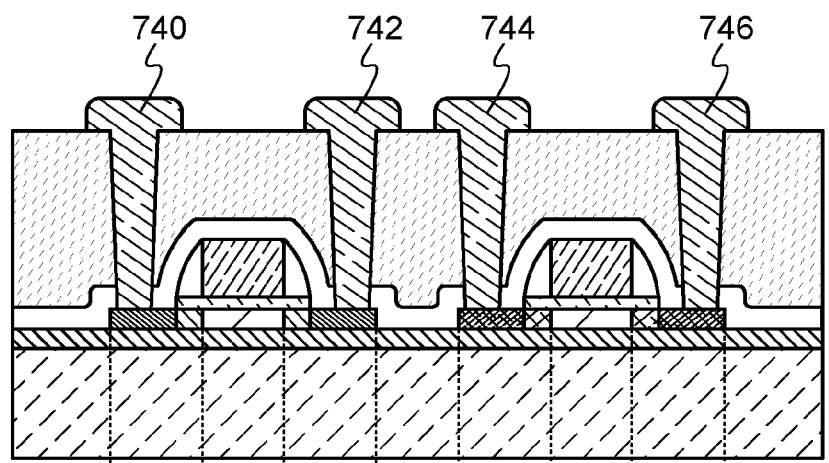
FIGS. 9A and 9B are a plan view and a cross-sectional view of a semiconductor device (transistor).
Figure 9B:
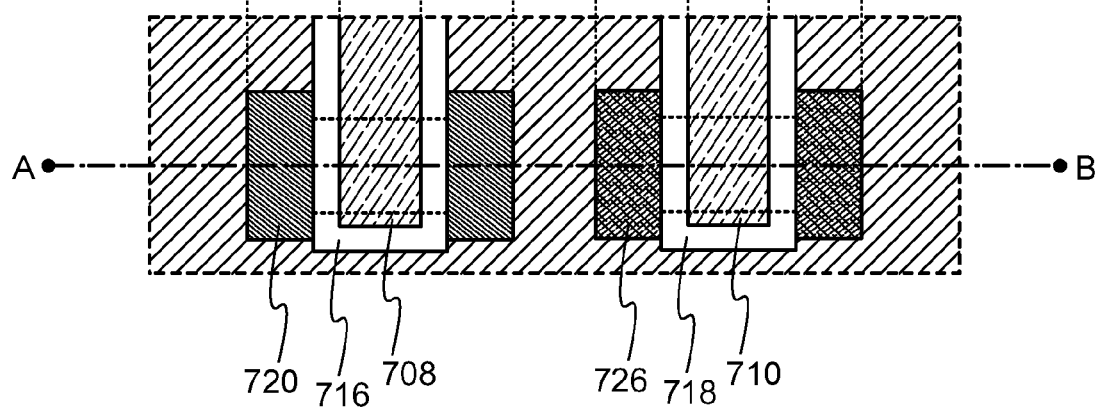

FIG. 9B is a plan view of the n-channel transistor 732 and the p-channel transistor 734 which are illustrated in FIG. 9A. Here, a cross section taken along line C-D in FIG. 9B corresponds to FIG. 9A. For simplicity, the conductive films 740, 742, 744, and 746 and the insulating films 736 and 738 and the like are omitted in FIG. 9B.

Note that although the case where the n-channel transistor 732 and the p-channel transistor 734 include their respective one electrode serving as a gate electrode (the electrode 708 and the electrode 710) is described in this embodiment, one embodiment of the present invention is not limited to this structure. The transistor manufactured according to one embodiment of the present invention may have a multi-gate structure in which a plurality of electrodes serving as gate electrodes are included and electrically connected to one another.

In this embodiment, the transistors are formed using a single crystal semiconductor layer. Accordingly, switching speed of the transistors is increased as compared to the case where an amorphous semiconductor layer, a non-single-crystal semiconductor layer, or the like is used. Further, in this embodiment, a preferable single crystal semiconductor layer without a stripe variation is used, so that variation in characteristics between the transistors can be suppressed enough. In this manner, a semiconductor device with high characteristics can be provided.

Note that the structure described in this embodiment can be implemented by being combined as appropriate with any other structure described in the other embodiments in this specification.

[Embodiment 4]

In this embodiment, electronic devices each using the semiconductor device manufactured according to the above embodiment, particularly using the display device will be described using FIGS. 10A to 10H and FIGS. 11A to 11C.

As electronic devices manufactured using a semiconductor device (particularly a display device), the following can be given: cameras such as a video camera and a digital camera, goggle-type displays (head mounted displays), navigation systems, audio reproducing devices (such as car audio components), computers, game machines, portable information terminals (such as a mobile computer, a mobile phone, a portable game machine, and an e-book reader), and image reproducing devices provided with a recording medium (specifically, a device provided with a display device that can reproduce a recording medium such as a digital versatile disc (DVD) and display the image), and the like.

Figure 10A:
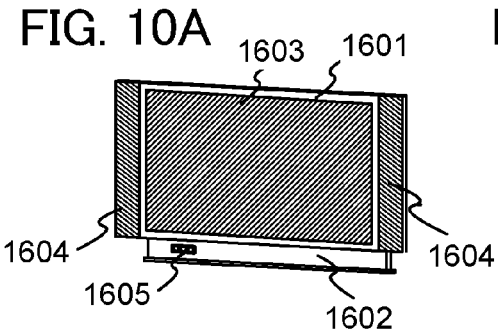
FIGS. 10A to 10H are views illustrating electronic devices each using a semiconductor device.

FIG. 10A illustrates a television set or a monitor of a personal computer. The television set or the monitor of the personal computer includes a housing 1601, a support stand 1602, a display portion 1603, speaker portions 1604, a video input terminal 1605, and the like. The semiconductor device according to one embodiment of the present invention is used in the display portion 1603. With the semiconductor device according to one embodiment of the present invention, a highly-reliable and high-performance television set or monitor of a personal computer can be provided.

Figure 10B:
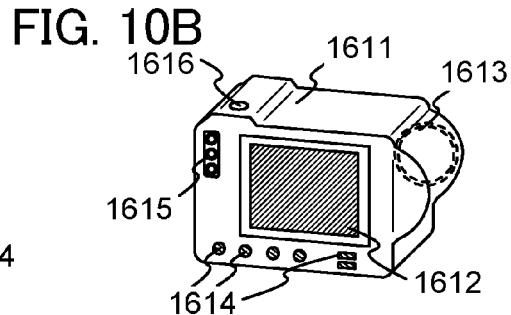

FIG. 10B illustrates a digital camera. An image receiving portion 1613 is provided in the front side of a main body 1611. A shutter button 1616 is provided at the upper portion of the main body 1611. A display portion 1612, operation keys 1614, and an external connection port 1615 are provided at the backside of the main body 1611. The semiconductor device according to one embodiment of the present invention is used in the display portion 1612. With the semiconductor device according to one embodiment of the present invention, a highly-reliable and high-performance digital camera can be provided.

Figure 10C:
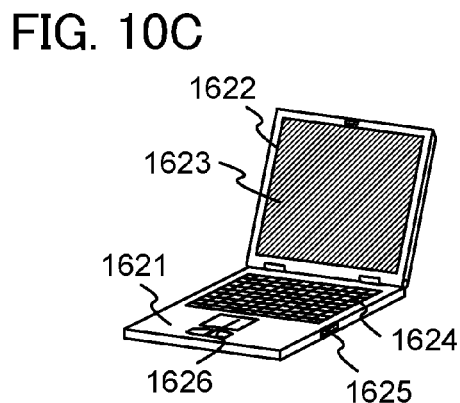
Figure 10D:
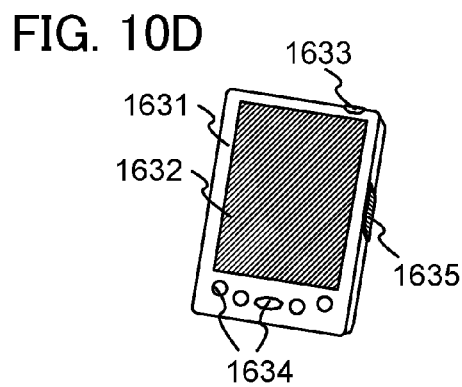

FIG. 10C illustrates a laptop personal computer. A main body 1621 is provided with a keyboard 1624, an external connection port 1625, and a pointing device 1626. A housing 1622 including a display portion 1623 is attached to the main body 1621. The semiconductor device according to one embodiment of the present invention is used in the display portion 1623. With the semiconductor device according to one embodiment of the present invention, a highly-reliable and high-performance laptop personal computer can be provided.

FIG. 16D illustrates a mobile computer including a main body 1631, a display portion 1632, a switch 1633, operation keys 1634, an infrared port 1635, and the like. An active matrix display device is provided in the display portion 1632. The semiconductor device according to one embodiment of the present invention is used in the display portion 1632. With the semiconductor device according to one embodiment of the present invention, a highly-reliable and high-performance mobile computer can be provided.

Figure 10E:
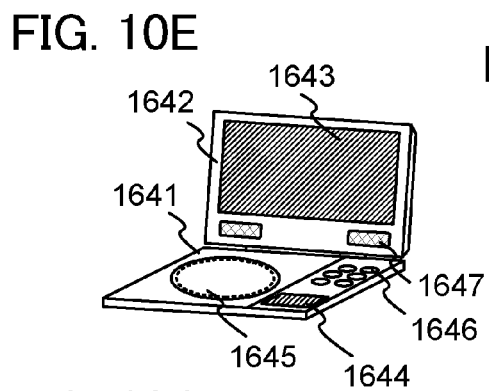

FIG. 10E illustrates an image reproducing device. A main body 1641 is provided with a display portion 1644, a recording medium reading portion 1645, and operation keys 1646. Further, a housing 1642 provided with speaker portions 1647 and a display portion 1643 is attached to the main body 1641.

The semiconductor device according to one embodiment of the present invention is used in each of the display portion 1643 and the display portion 1644. With the semiconductor device according to one embodiment of the present invention, a highly-reliable and high-performance image reproducing device can be provided.

Figure 10F:
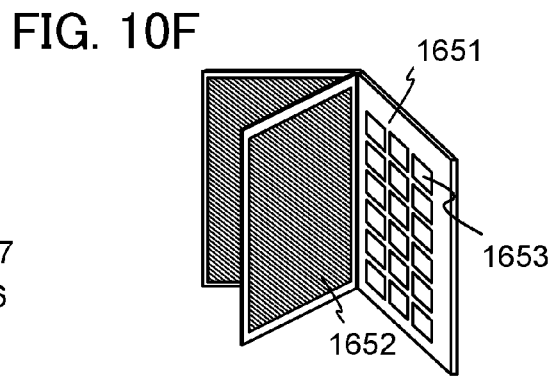

FIG. 10F illustrates an electronic book. A main body 1651 is provided with operation keys 1653. A plurality of display portions 1652 are attached to the main body 1651. The semiconductor device according to one embodiment of the present invention is used in the display portions 1652. With the semiconductor device according to one embodiment of the present invention, a highly-reliable and high-performance electronic book can be provided.

Figure 10G:
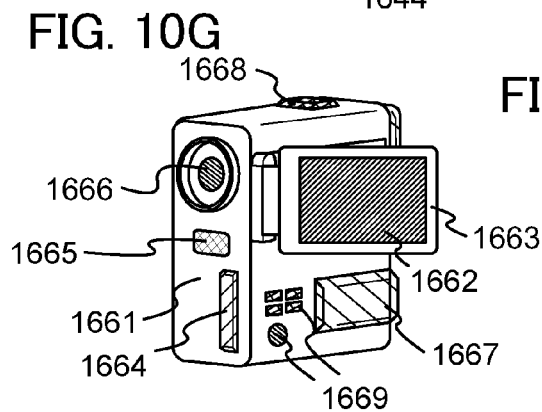

FIG. 10G illustrates a video camera. A main body 1661 is provided with an external connection port 1664, a remote control receiving portion 1665, an image receiving portion 1666, a battery 1667, an audio input portion 1668, and operation keys 1669. A housing 1663 provided with a display portion 1662 is attached to the main body 1661. The semiconductor device according to one embodiment of the present invention is used in the display portion 1662. With the semiconductor device according to one embodiment of the present invention, a highly-reliable and high-performance video camera can be provided at low cost.

Figure 10H:
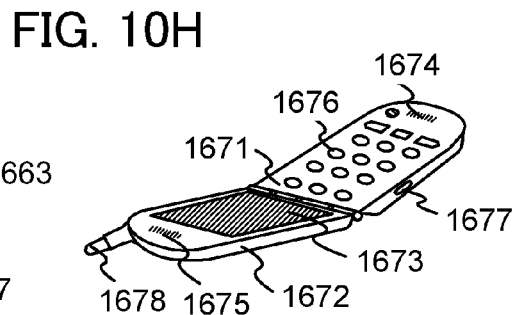

FIG. 10H illustrates a mobile phone, which includes a main body 1671, a housing 1672, a display portion 1673, an audio input portion 1674, an audio output portion 1675, operation keys 1676, an external connection port 1677, an antenna 1678, and the like. The semiconductor device according to one embodiment of the present invention is used in the display portion 1673. With the semiconductor device according to one embodiment of the present invention, a highly-reliable and high-performance mobile phone can be provided.

Figure 11A:
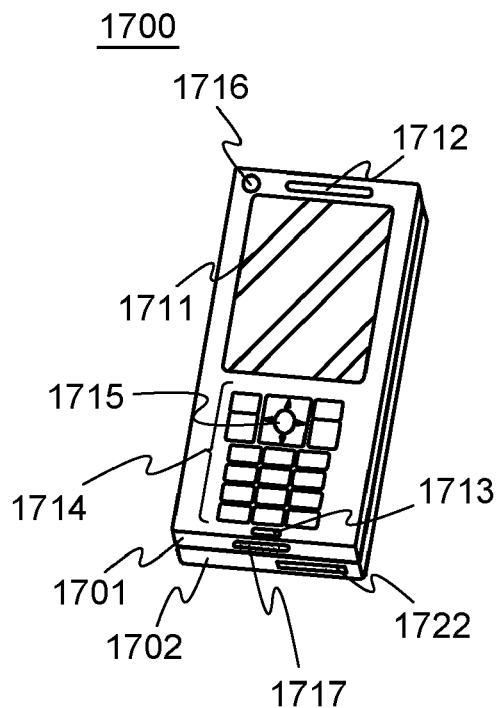
FIGS. 11A to 11C are views illustrating an electronic device using a semiconductor device.
Figure 11B:
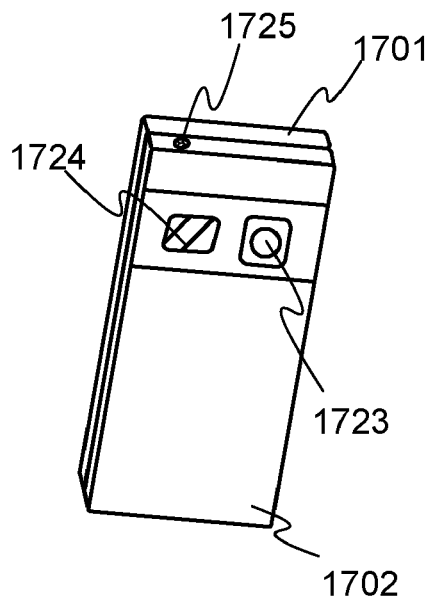
Figure 11C:
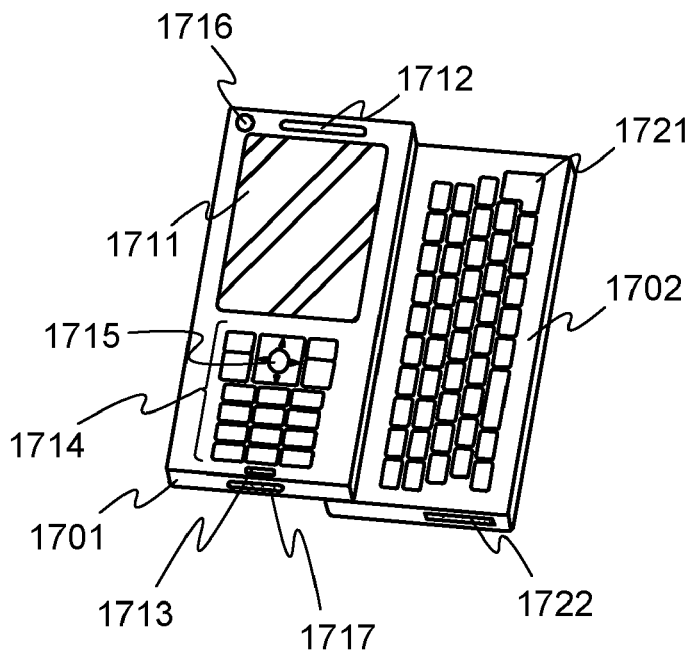

FIGS. 11A to 11C illustrate a structural example of a portable electronic device 1700 having functions as a telephone and an information terminal. FIG. 11A is a front view, FIG. 11B is a back view, and FIG. 11C is a developed view. The portable electronic device 1700 has functions as both a telephone and an information terminal and is an electronic device so-called a smartphone which is capable of various data processing besides voice call.

The portable electronic device 1700 includes housings 1701 and 1702. The housing 1701 is provided with a display portion 1711, a speaker 1712, a microphone 1713, operation keys 1714, a pointing device 1715, a lens 1716 for camera, an external connection terminal 1717, and the like. The housing 1702 is provided with a keyboard 1721, an external memory slot 1722, a lens 1723 for camera, a light 1724, an earphone terminal 1725, and the like. In addition, an antenna is incorporated in the housing 1701. In addition to the above-described structure, a wireless IC ship, a small size memory device, or the like can be built therein.

The semiconductor device according to one embodiment of the present invention is incorporated in the display portion 1711. An image displayed (and direction in which the image is displayed) in the display portion 1711 variously changes depending on the usage mode of the portable electronic device 1700. Moreover, the display portion 1711 and the lens 1716 for camera which are provided on the same plane enables voice call with images (so-called videophone). Note that the speaker 1712 and the microphone 1713 can be used not only for voice call but also for recording, reproducing, or the like. In the case where a still image and a moving image are shot by using the lens 1723 for camera (and the light 1724), the display portion 1711 is used as a finder. The operation keys 1714 are used for operation of incoming and outgoing calls, simple information input for electronic mail or the like, scrolling of a screen, cursor motion, and the like.

The housings 1701 and 1702 overlapped with each other (FIG. 11A) can slide and be developed as illustrated in FIG. 11C, so that the portable electronic device 1700 can be used as an information terminal In that case, the keyboard 1721 and the pointing device 1715 enables smooth operation. The external connection terminal 1717 can be connected to various kinds of cables such as an AC adopter or a USB cable, which enables charging and data communication with a computer or the like. Further, by inserting a recording medium into the external memory slot 1722, the portable electronic device 1700 can be used for storing and moving a large capacity of data. In addition to the above-described functions, a function of wireless communication by using electromagnetic waves such as infrared rays, a function of receiving television, and the like can be provided. With the semiconductor device according to one embodiment of the present invention, a highly-reliable and high-performance portable electronic device can be provided.

As described above, the applicable range of the present invention is extremely wide and the present invention can be used for electronic device in various fields. Note that this embodiment can be implemented by being combined as appropriate with any other structure described in the other embodiments in this specification.

This application is based on Japanese Patent Application serial no. 2008-249401 filed with Japan Patent Office on Sep. 29, 2008, the entire contents of which are hereby incorporated by reference.

What is claimed is:

1. A method for manufacturing a semiconductor device, comprising the steps of:
   forming a first insulating layer on a first single crystal semiconductor substrate,
   irradiating the first single crystal semiconductor substrate with accelerated ions so that a fragile region is formed in the first single crystal semiconductor substrate;
   forming a depression in a surface of the first insulating layer, the depression provided over a peripheral area of the first single crystal semiconductor substrate;
   forming a second insulating layer over a second single crystal semiconductor substrate, the second insulating layer comprising nitrogen;
   bonding the first single crystal semiconductor substrate to the second single crystal semiconductor substrate with the first insulating layer and the second insulating layer interposed therebetween;
   separating the first single crystal semiconductor substrate at the fragile region, so that a single crystal semiconductor layer is formed over the second single crystal semiconductor substrate; and
   removing at least a region of the single crystal semiconductor layer, the region of the single crystal semiconductor layer being outside of the depression.

2. The method for manufacturing a semiconductor device, according to claim 1, wherein the single crystal semiconductor layer is irradiated with laser light to improve characteristics of the single crystal semiconductor layer.

3. The method for manufacturing a semiconductor device, according to claim 1, wherein the second insulating layer comprises a material selected from the group consisting of silicon nitride and silicon nitride oxide.

4. The method for manufacturing a semiconductor device, according to claim 1, wherein the first insulating layer is formed by a thermal oxidation treatment.

5. The method for manufacturing a semiconductor device, according to claim 4, wherein the thermal oxidation treatment is performed in an oxidizing atmosphere to which halogen is added.

6. The method for manufacturing a semiconductor device, according to claim 1, further comprising a step of patterning the single crystal semiconductor layer,
wherein the first insulating layer under the region of the single crystal semiconductor layer being provided outside of the depression is removed in the step of patterning the single crystal semiconductor layer.

7. The method for manufacturing a semiconductor device, according to claim 1, wherein the depression is formed by patterning or marking by laser light irradiation.

8. A method for manufacturing a semiconductor device, comprising the steps of:
irradiating a first single crystal semiconductor substrate with accelerated ions so that a fragile region is formed in the first single crystal semiconductor substrate;
forming an insulating layer on a second single crystal semiconductor substrate, the insulating layer having a depression on a peripheral area of the first single crystal semiconductor substrate, and the insulating layer comprising nitrogen;
bonding the first single crystal semiconductor substrate to the second single crystal semiconductor substrate with the insulating layer interposed therebetween;
separating the first single crystal semiconductor substrate at the fragile region, so that a single crystal semiconductor layer is formed over the second single crystal semiconductor substrate; and
removing at least a region of the single crystal semiconductor layer, the region of the single crystal semiconductor layer being outside of the depression.

9. The method for manufacturing a semiconductor device, according to claim 8, wherein the single crystal semiconductor layer is irradiated with laser light to improve crystal quality of the single crystal semiconductor layer.

10. The method for manufacturing a semiconductor device, according to claim 8, wherein the insulating layer comprises a material selected from the group consisting of silicon nitride and silicon nitride oxide.

11. The method for manufacturing a semiconductor device, according to claim 8, further comprising a step of patterning the single crystal semiconductor layer,
wherein the insulating layer under the region of the single crystal semiconductor layer being provided outside of the depression is removed in patterning the single crystal semiconductor layer.

12. The method for manufacturing a semiconductor device, according to claim 8,
wherein the depression is formed by patterning or marking by laser light irradiation.

* * * * *